United States Patent
Tsujita et al.

Patent Number: 5,955,227
Date of Patent: Sep. 21, 1999

[54] PATTERN DETERMINATION METHOD

[75] Inventors: Kouichirou Tsujita; Junjiro Sakai; Akihiro Nakae, all of Hyogo, Japan

[73] Assignee: Mitsubishi Denki Kabushiki Kaisha, Tokyo, Japan

[21] Appl. No.: 09/089,492

[22] Filed: Jun. 2, 1998

[30] Foreign Application Priority Data

Jan. 8, 1998 [JP] Japan .................. 10-002505

[51] Int. Cl.⁶ .................. G03F 9/00; G03C 5/00
[52] U.S. Cl. .................. 430/30; 430/311
[58] Field of Search .................. 430/30, 311

Primary Examiner—Christopher G. Young
Attorney, Agent, or Firm—McDermott, Will & Emery

[57] ABSTRACT

A pattern determination method includes a step for setting an interconnection width and the like, a step for representing the mask pattern and aperture configuration in functions, steps for calculating amplitude distribution of exposure light, a step for calculating intensity distribution of exposure light at an image plane, steps for calculating maximum, minimum, and reference intensity of exposure light, a step for determining exposure margin and focus margin, a step for storing data of qualification/disqualification of optical image formation, and a step for providing a display of a table. A configuration including four openings is set for the aperture. Determination of whether an optical image of an interconnection pattern can be formed or not is facilitated by the table in setting the interconnection pattern of a semiconductor device.

3 Claims, 22 Drawing Sheets

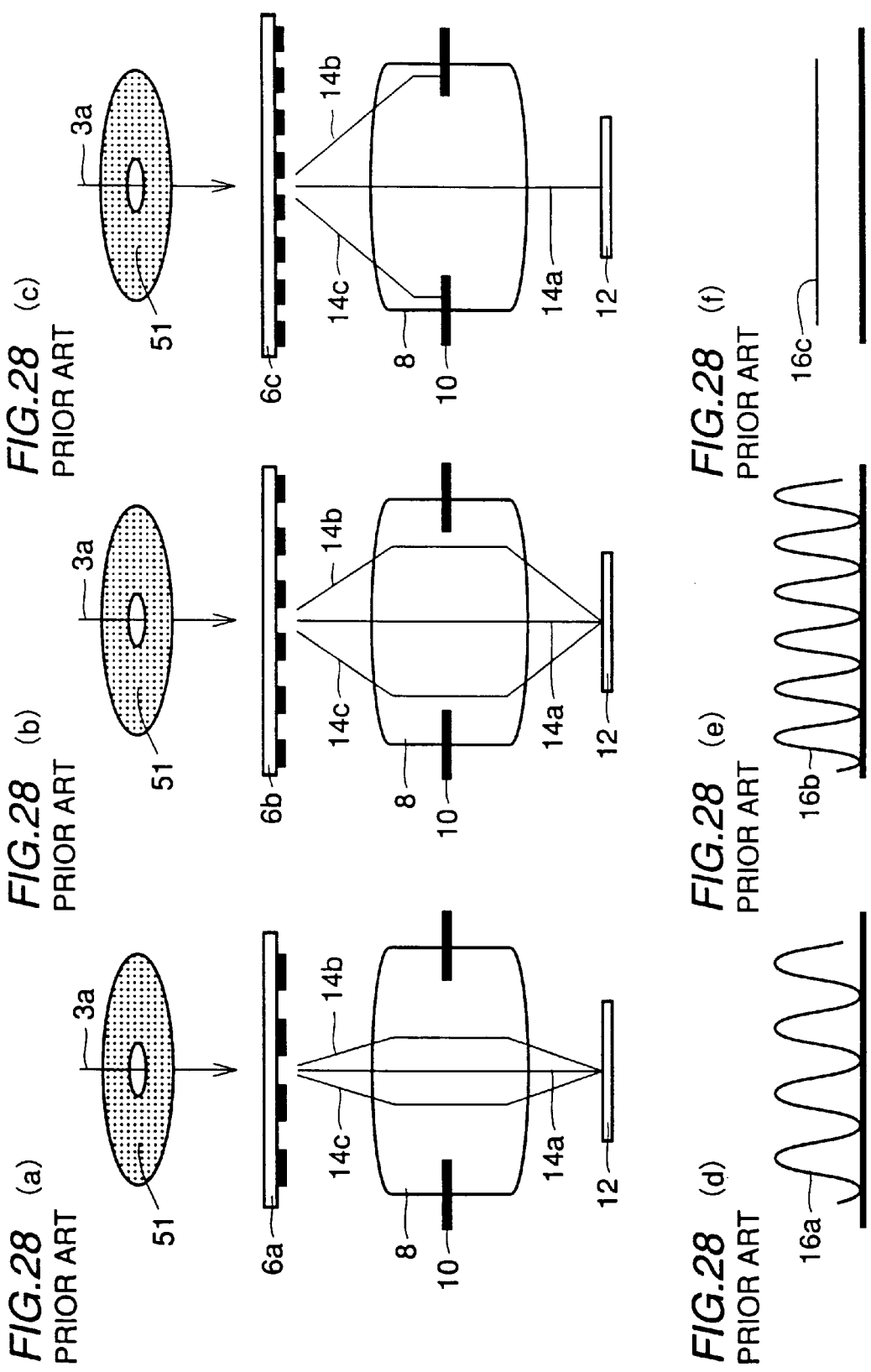

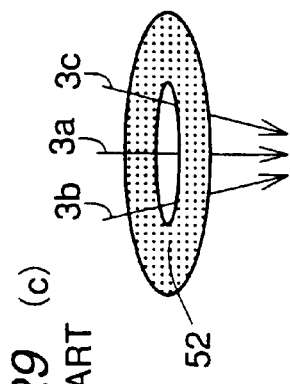
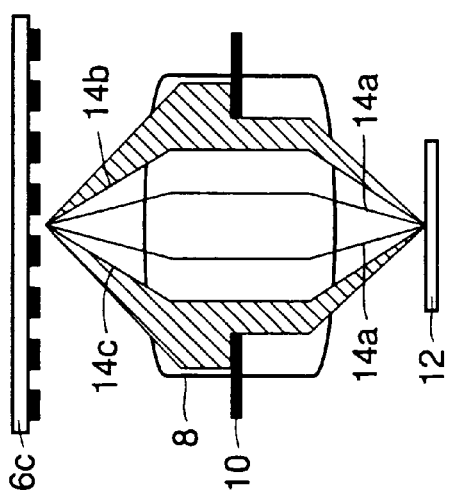
FIG.29 (a) PRIOR ART        FIG.29 (b) PRIOR ART        FIG.29 (c) PRIOR ART
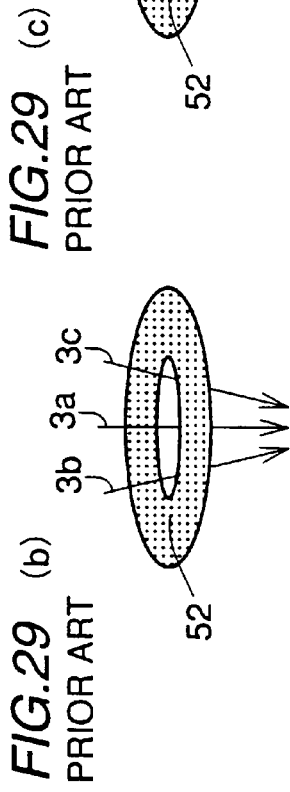
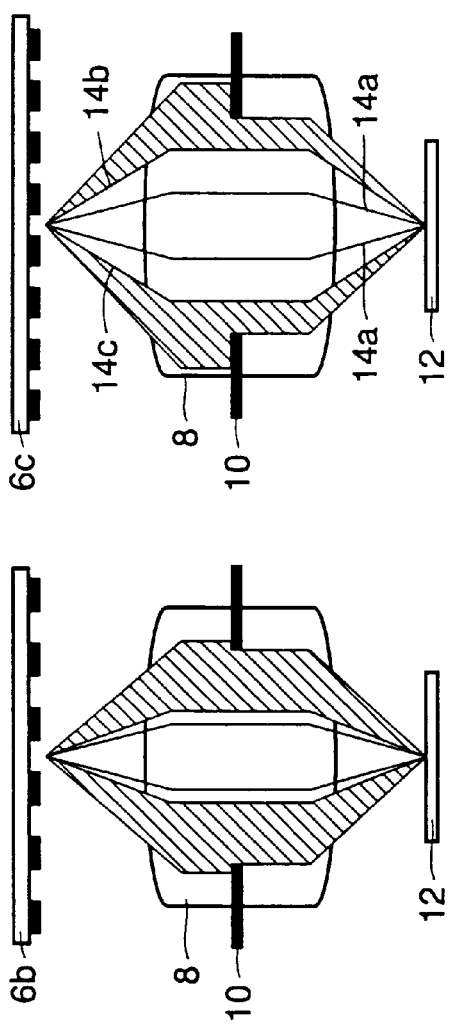
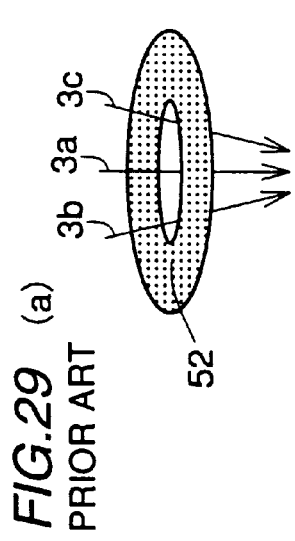
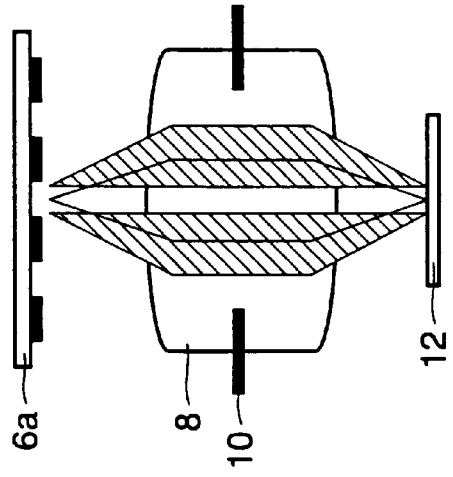
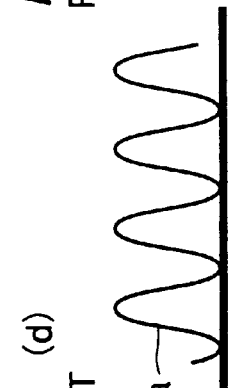
FIG.29 (d) PRIOR ART        FIG.29 (e) PRIOR ART        FIG.29 (f) PRIOR ART

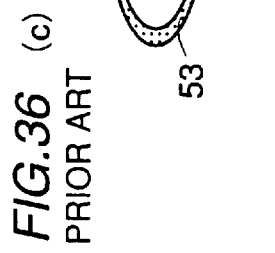
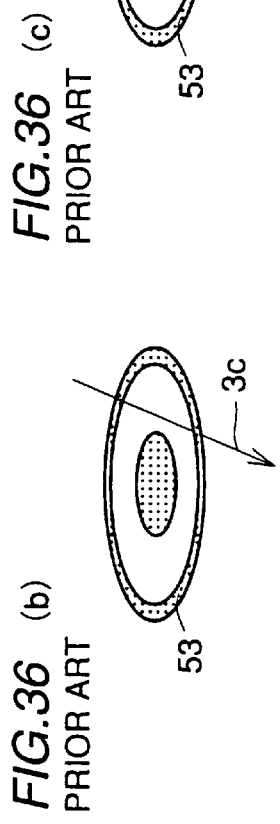
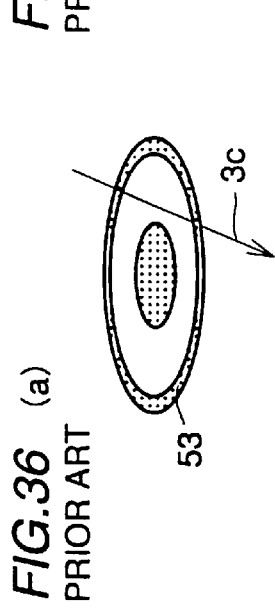
FIG.36 (a) PRIOR ART
FIG.36 (b) PRIOR ART
FIG.36 (c) PRIOR ART
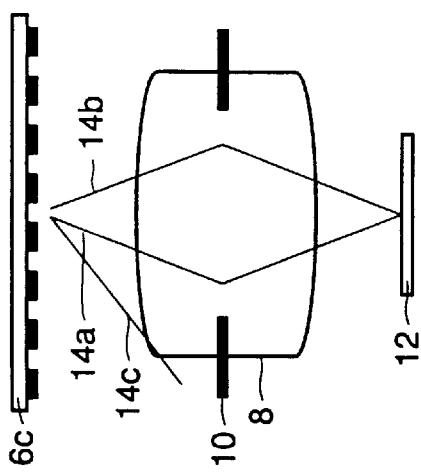
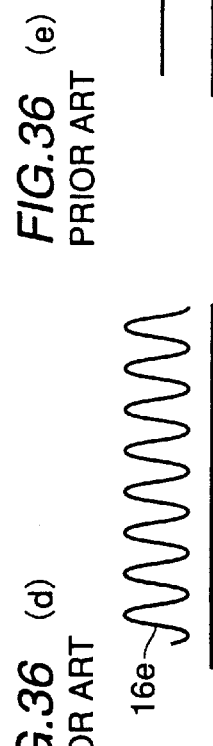
FIG.36 (d) PRIOR ART
FIG.36 (e) PRIOR ART
FIG.36 (f) PRIOR ART

PATTERN DETERMINATION METHOD

BACKGROUND OF THE INVENTION

1. Field of the Invention

The present invention relates to a pattern determination method and an aperture employed in an exposure apparatus. More particularly, the present invention relates to a pattern determination method for facilitating determination of whether an optical image of an interconnection pattern is formed or not in setting the width of an interconnection and distance between adjacent interconnections in the interconnection pattern of a semiconductor device, and an aperture employed in an exposure apparatus that has light proximity effect reduced in the interconnection pattern.

2. Description of the Background Art

The semiconductor industry is moving rapidly towards microminiaturization in the pattern of a semiconductor integrated circuit device to meet the demand of increase in the integration density and microminiaturization in the semiconductor integrated circuit device. In particular, the photolithographic technique is the basic technology in pattern formation. Photolithography is the technique to transfer the pattern on a mask onto a photoresist applied on a wafer plane by an exposure apparatus.

The basic optical system of an exposure apparatus will be described first. Referring to FIG. 27, exposure light emitted from a light source such as a KrF excimer laser (not shown) passes through a condenser lens 4 by a fly eye lens 2 (light source plane) formed of a group of microlens to be directed to a mask 6.

The exposure light emitted from each microlens is directed all over mask 6 through condenser lens 4. The exposure light particularly passing through the microlens in the proximity of the center of the optical axis is directed substantially perpendicular to the plane of mask 6. In contrast, the exposure light passing through the microlens located at the peripheral area is directed to the plane of mask 6 in an oblique manner. Therefore, an aperture having an opening formed at a predetermined position is arranged in the proximity of fly eye lens 2 so that the exposure light is directed to the plane of mask 6 at an appropriate incident angle.

The exposure light directed to mask 6 is diffracted by the pattern on mask 6. The diffracted light is subjected to Fourier transform by a projection lens 8, whereby a transform image thereof is formed on a pupil plane 10. The transform image is subjected to inverse Fourier transform, whereby an optical image of the pattern is formed on an image plane 12 (wafer plane).

Whether an optical image of the pattern is formed on image plane 12 or not depends upon the incident angle of the exposure light onto the plane of mask 6 and the diffraction angle of the exposure light. The irradiation of mask 6 on which a line and spacer pattern is formed with only perpendicular exposure light will be described with reference to FIGS. 28($a$)–28($f$).

The diffraction angle $\theta$ of the exposure light passing through the line and space pattern is represented as:

$$\sin \theta = n\lambda/\text{pitch} \ (n=0, \pm 1, \ldots)$$

Here, the pitch is the sum of the line width and space. $\lambda$ is the wavelength of the light source.

It is appreciated from the above expression that the diffraction angle becomes greater as the value of the pitch is smaller, and that the diffraction angle becomes smaller as the value of the pitch becomes greater.

When the line and space pattern of masks 6$a$ and 6$b$ is relatively coarse as shown in FIGS. 28($a$) and ($b$), the diffraction angle of the exposure light is relatively small, so that ± first order diffracted light 14$b$ and 14$c$ pass through pupil plane 10.

By the interference of zero order diffracted light 14$a$ and ± first order diffracted light 14$b$ and 14$c$, optical images 16$a$ and 16$b$ of the pattern are formed on image plane 12 as shown in FIGS. 23($d$) and 23($e$).

However, when the line and space pattern of mask 6$c$ is dense as shown in FIG. 28($c$), the diffraction angle of the exposure light becomes greater. Therefore, ± first order diffracted light 14$b$ and 14$c$ cannot pass through pupil plane 10. Only zero order diffracted light 14$a$ passes through pupil plane 10.

As a result, an optical image of the pattern cannot be formed on image plane 12 as shown in FIG. 28($f$). In other words, an optical image of a fine pattern cannot be formed by the method of directing the exposure light perpendicular to the mask.

There is a method of providing some margin in the incident angle of the exposure light towards the mask so that an optical image of a fine pattern can be formed. This method employs an aperture of a greater opening diameter so that the exposure light emitted from the periphery of fly eye lens 2 is directed to the mask.

As shown in FIGS. 29($a$)–29($c$), exposure light 3$a$, 3$b$ and 3$c$ is directed to the mask at different angles by an aperture 52. When the line and space pattern of masks 6$a$ and 6$b$ is relatively coarse as shown in FIGS. 29($a$) and 29($b$), the ± first order diffracted light of every exposure light 3$a$, 3$b$ and 3$c$ pass through pupil plane 10. As a result, optical images 16$a$ and 16$b$ of the pattern can be formed on image plane 12 as shown in FIGS. 29($d$) and 29($e$).

When the line and space pattern of mask 6$c$ is more dense as shown in FIG. 29($c$), a portion of zero order diffracted light 14$a$ and ± first order diffracted light 14$b$ of exposure light 3$c$ and a portion of zero order diffracted light 14$a$ and –1 order diffracted light 14$c$ of exposure light 3$b$ pass through pupil plane 10. Although the image quality is not complete, an optical image 16$d$ of the pattern is formed as shown in FIG. 29($f$).

For a fine pattern, an optical image of the pattern cannot be formed according to the method in which the exposure light is directed perpendicular to the mask whereas an optical image of the pattern can be formed according to the method in which exposure light directed oblique to the mask is included.

In the above-described method of directing two exposure light to the mask, the zero order diffracted light and ± first order diffracted light contribute to formation of an optical image. In other words, an optical image can be formed on the image plane by the interference of the three luminous flux. However, in the fine pattern shown in FIGS. 28($c$) and 29($c$), ± first order diffracted light 14$b$ and 14$c$ of exposure light 3$a$ directed perpendicular to mask 6$c$ cannot pass through pupil plane 10. Only zero order diffracted light 14$a$ passes through pupil plane 10 as shown in FIG. 30($a$). The zero order diffracted light is greater in intensity than the first order diffracted light, so that the contrast of the optical image is reduced as shown in FIG. 30($b$).

In view of the foregoing, a method is proposed to correspond to microminiaturization, wherein exposure light directed perpendicular to the mask is blocked, and exposure is carried out only by the light directed oblique to the mask.

In this case, an aperture 53 having the center area blocked is employed as shown in FIG. 31($a$) to block any exposure light directed perpendicular to mask 6c. This method employing such an aperture 53 is referred to as modified illumination, particularly annular illumination, from the configuration of the aperture. The previously-described two methods are referred to as normal illumination.

In the annular illumination, zero order diffracted light 14a and first order diffracted light 14b of exposure light 3c pass through pupil plane 10. An optical image 16e can be formed on image plane 12 as shown in FIG. 31(b).

This is particularly called double-beam interference since an optical image is formed by the interference of two beams of zero order diffracted light 14a and first order diffracted light 14b.

In double-beam interference, the phase of the exposure light passing through from the opening adjacent to the pattern of mask 6d should be shifted by π, as shown in FIG. 32, according to the Huygens principle. The phase difference of the exposure light can be shifted by just π by the method of adjusting the incident angle towards the mask. For example, as shown in FIG. 33, the incident angle to the mask is adjusted so that the light path difference of exposure light 3d arriving at the opening portion of mask 6d is shifted by just the phase of π. In this case, the incident angle of the exposure light must be altered according to the pattern.

There is also the method of using a phase shift mask 6e as shown in FIG. 34. Phase shift mask 6e has a phase shifter 6 provided at every one adjacent opening of mask 6e. A phase difference π is generated between the exposure light passing through phase shifter 6f and the exposure light that does not pass through.

The aperture employed in annular illumination includes a 50% zone aperture, 60% zone aperture, and the like depending upon the ratio of the area blocking the exposure light to the entire area of the aperture. This ratio becomes greater for an aperture corresponding to a finer pattern. However, the aperture employed in annular illumination is not intended to improve the resolution of a particular pattern. It slightly improves the resolution of an undefined pattern.

The feature of the above exposure method by modified illumination will be described in recapitulation in comparison with the exposure method by normal illumination.

In the case of normal illumination with a relatively small pitch as shown in FIG. 35, the diffraction angle of ± first order diffracted light 14b and 14c of exposure light 3a directed perpendicular to mask 6c is relatively great. Therefore, ± first order diffracted light 14b and 14c cannot pass through pupil plane 10. As a result, an optical image of the pattern cannot be formed on the image plane.

In modified illumination, only − first order diffracted light 14c cannot pass through pupil plane 10 out of the ± first order diffracted light 14b and 14c of exposure light 3c directed oblique to mask 6c. + first order diffracted light 14b and zero order diffracted light 14a can pass through pupil plane 10. Therefore, an optical image of the pattern can be formed on the image plane.

In the case of normal illumination with a relatively great pitch, the diffraction angle of the diffracted light of exposure light 3a directed perpendicular to mask 6a is relatively small. Therefore, the diffracted light of a high order including the ± first order diffracted light can pass through pupil plane 10. As a result, an optical image of the pattern can be formed on the image plane.

In modified illumination, the diffraction angle of the diffracted light of exposure light 3c directed oblique to mask 6a is relatively small. Therefore, the diffracted light of high order including the + first order diffracted light can pass through pupil plane 10. As a result, an optical image of the pattern can be formed on the image plane.

Particularly when the pitch is great, there is no great difference in the distribution of the diffracted light passing through the pupil plane between normal illumination and modified illumination. Therefore, it can be said that modified illumination is effective for a fine line and space pattern, and not so effective for a relatively great line and space pattern. The level thereof is equal to that of normal illumination.

The exposure method of modified illumination had the problem that the resolution of the line and space pattern is degraded as the pitch is altered even if the line width is constant. There is also the problem that the amount of change in the finish dimension of the line is altered depending upon the modified illumination due to the light proximity effect. This light proximity effect is a phenomenon in which the line (interconnection) finish dimension is altered depending upon the space (distance) from an adjacent line.

The former problem will be described first. In modified illumination, zero order diffracted light and + first order diffracted light of exposure light 3c directed oblique to mask 6c pass through pupil plane 10 as shown in FIG. 36(a). As a result, an optical image 16e is formed at the image plane as shown in FIG. 36(d).

When the space is increased (pitch increased) with a constant line width, the diffraction angle of the exposure light becomes smaller. In this case, the diffracted light of high order including the first order diffracted light passes through pupil plane 10 as shown in FIG. 36(b). The diffracted light passing through pupil plane 10 is directed to image plane 12 through projection lens 8. Here, the incident angle $\theta_1$ of the diffracted light passing through the neighborhood of pupil plane 10 becomes greater. The relationship of:

$$DOF = k \cdot \lambda/(\sin \theta)^2,$$

where k is a proportional constant is established between the incident angle θ of the diffracted light and the value of the depth of focus DOF. Therefore, the depth of focus becomes smaller as the value of θ becomes greater.

This depth of focus is the focus range that can maintain a constant image formation performance. Therefore, a smaller value of the depth of focus means that the focus range is narrowed. Therefore, the resolution of the optical image is degraded. As a result, there is a possibility that an optical image is not formed as shown in FIG. 36(e), particularly in the case of a defocus situation.

When the space is further reduced (smaller pitch) with a constant line width, the diffraction angle of the exposure light is further increased. In this case, + first order diffracted light 14b passes through a region more close to pupil plane 10 as shown in FIG. 36(c). The incident angle $\theta_2$ of + first order diffracted light 14b into image plane 12 becomes greater. Therefore, the depth of focus becomes smaller, similar to the case of FIG. 36(b). As a result, there is a possibility that an optical image is not formed as shown in FIG. 36(f), particularly in the case of a defocus state.

When the line width is altered with the space set constant, the diffraction angle of the diffracted light changes since the pitch is altered. Therefore, a similar phenomenon occurs.

The above description implies that, when modified illumination is employed in patterning the interconnection where the width of the interconnection pattern is set minimum in a semiconductor device, an image of a pattern that has the spacing between interconnections exceed a certain value cannot be formed.

Also, even if the minimum space is set, an image of a pattern in which the width of an interconnection located adjacent to the space exceeds a certain value cannot be formed.

Thus, the interconnection width and the like of an interconnection pattern cannot be easily determined in designing a semiconductor device.

The latter problem will be described hereinafter.

FIG. 37(a) shows the assessment of a simulation in the variance in the finished dimension of the interconnection width when space S is altered with a constant interconnection width L in the interconnection pattern of FIG. 37(b). The interconnection width is set to 0.22 μm. The finish dimension of the interconnection was strongly influenced by the light proximity effect as the space is increased to become smaller than the predetermined dimension for both the ½ annular illumination and ⅔ annular illumination. Although the dimension gradually approaches the predetermined dimension as the space is further increased, there was still a difference from the predetermined dimension. It was found that the difference differs between the ½ annular illumination and ⅔ annular illumination and depends upon the configuration of the aperture.

SUMMARY OF THE INVENTION

In view of the foregoing, an object of the present invention is to provide a pattern determination method facilitating determination of whether an optical image of an interconnection pattern is formed or not in setting the interconnection width and distance between adjacent interconnections in the interconnection pattern of a semiconductor device.

Another object of the present invention is to provide an aperture that has variation reduced in the finish dimension of an interconnection pattern caused by light proximity effect.

A further object of the present invention is to provide a method of determining an opening configuration in such an aperture.

Still another object of the present invention is to provide a method of forming a semiconductor pattern forming a desired interconnection on a semiconductor substrate by a mask having an interconnection pattern according to image formation qualify/disqualify data of an optical image of an interconnection pattern.

A pattern determination method according to an aspect of the present invention, includes the steps of: setting the interconnection width and the distance between that interconnection and an adjacent interconnection; setting the pattern of a mask according to the width and distance, and a configuration of an aperture through which exposure light is directed to the mask at a predetermined angle; calculating the exposure light intensity distribution at the wafer plane of the exposure light emitted from a light source plane and passing through the aperture and mask; calculating the maximum or minimum exposure light intensity of the exposure light intensity distribution; setting a reference exposure light intensity; calculating the amount of defocus for the reference exposure light intensity; determining whether an optical image of the mask pattern can be formed on the wafer plane according to the reference exposure light intensity, maximum exposure light intensity, minimum exposure light intensity and amount of defocus; forming a pattern formation quality/disqualify table with the image formation qualify/disqualify data corresponding to the width and distance; and determining the width of an interconnection and the distance between interconnections for a semiconductor device according to the pattern formation qualify/disqualify table.

According to the present method, the range of the pattern that can have an optical image formed is visualized by a table for the pattern of the interconnection and distance. Therefore, determination can easily be made whether an optical image of an interconnection pattern is formed or not in setting the interconnection width and distance from an adjacent interconnection in designing a semiconductor device.

Preferably, the aperture in the step of setting a configuration of an aperture includes an opening having at least a first opening edge, a second opening edge, a third opening edge and a fourth opening edge, formed at each of four regions divided by virtual first and second axes orthogonal to each other with the position corresponding to the optical axis of the exposure light as a crossing point. The first and second opening edges are parallel to the first axis, and located closer to and more remote from the first axis, respectively. The third and fourth opening edges are parallel to the second axis, and located closer to and more remote from the second axis, respectively.

According to this aperture, the exposure light in the range from a position corresponding to the first and second axes to the first or third opening edge is blocked, and not directed to the mask. Here, the first and second axes correspond to the direction of translation (X direction, Y direction) of the wafer plane.

Therefore, the resolution of the fine interconnection and distance pattern parallel to the first or second axis is improved. The range of the pattern that allows formation of an optical image is increased. The range thereof is represented as a rectangle on a table. Thus, determination is further facilitated in setting the interconnection width of a semiconductor device.

According to another aspect of the present invention, an aperture is used in an exposure apparatus. The aperture includes an opening having at least first to fourth opening edges. The opening is formed in each of four regions divided by virtual first and second axes orthogonal to each other with the position corresponding to the optical axis of the exposure light of the exposure apparatus as a crossing point. The first opening edge is parallel to the first axis, and located closer to the first axis than the second opening edge. The second opening edge is parallel to the first axis, and located more remote from the first axis than the first opening edge. The third opening edge is parallel to the second axis, and located closer to the second axis than the fourth opening edge. The fourth opening edge is parallel to the second axis, and located more remote from the second axis than the third opening edge. A plurality of patterns of an interconnection and distance are set with the distance between interconnections as a variable with respect to the interconnection width of a semiconductor device. Also, the configuration of a plurality of openings of the aperture is set with the position of the first to fourth opening edges as respective variables. The intensity distribution of respective exposure light on the wafer plane is obtained by combining each interconnection and distance pattern and each opening configuration. By comparing each intensity distribution of the exposure light with a reference intensity distribution, the finish dimension of the resist on the wafer plane is obtained. The first to fourth opening edges are set so that the difference between each finish dimension and a corresponding design dimension is minimum with respect to each interconnection and distance pattern having a pitch at least two times the minimum pitch. The pitch is the sum of the width and distance.

According to this structure, the exposure light in the range from the position corresponding to the first and second axes to the first or third opening edge is blocked, and not directed to the mask. The light proximity effect is minimized for an interconnection and distance pattern having a pitch at least two times the minimum pitch. As a result, the accuracy of the finish dimension of a resist corresponding to an interconnection pattern parallel to the first or second axis in a semiconductor device is improved for a pitch greater than a predetermined value. The virtual first and second axes correspond to the direction of translation (X direction, Y direction) of the exposed wafer plane.

Preferably, when the numerical aperture of the exposure apparatus is 1, the position at the pupil plane corresponding to the position of the first or third opening edge of the aperture is 0.22±0.02, and the position at the pupil plane corresponding to the position of the second or fourth opening edge is 0.62±0.02.

In this case, the difference between the finish dimension and the design dimension of the interconnection and distance pattern having a pitch of at least 0.96 μm with respect to the minimum pitch of 0.48 μm is minimized. In the actual exposure apparatus, the values of these two positions are considered to be in the tolerable range when within ±0.02.

The method of determining an opening configuration of an aperture according to a further aspect of the present invention, includes the steps of: setting a plurality of patterns of interconnection and distance with the distance between interconnections as a variable with respect to the interconnection width of a semiconductor device; setting the configuration of a plurality of openings of the aperture with the position of the first to fourth opening edges as variables; combining each interconnection and distance pattern and each opening configuration to calculate respective intensity distribution of exposure light on the wafer plane; calculating a finish dimension of a resist on the wafer plane by each intensity distribution of exposure light and a reference intensity distribution; calculating the difference between each finish dimension and a corresponding design dimension for each interconnection and distance pattern having a pitch at least two times the minimum pitch, where the pitch is a sum of the width and distance; and setting the position of the first to fourth opening edges so that the dimension difference is minimized. The aperture includes the opening formed in each of four regions divided by virtual first and second axes orthogonal to each other with the position corresponding to the optical axis of the exposure light as a crossing point. The opening includes at least first and second opening edges parallel to the first axis, and located closer to and remote from the first axis, respectively, and third and fourth opening edges parallel to the second axis, and located closer to and more remote from the second axis, respectively.

According to this method, an aperture having light proximity effect minimized for an interconnection and distance pattern having a pitch of at least two times the minimum pitch in an interconnection pattern of a semiconductor device is obtained.

According to still another aspect of the present invention, a method of forming a semiconductor pattern includes the following steps. The width of an interconnection and distance between interconnections are set. A pattern of a mask according to that width and distance, and the configuration of the aperture for directing exposure light to the mask at a predetermined angle are set. The exposure light intensity distribution at the wafer plane of the exposure light emitted from a light source plane and passing through the aperture and the mask is calculated. The maximum exposure light intensity or minimum exposure light intensity in the exposure light intensity distribution is calculated. The reference exposure light intensity is set. The amount of defocus with respect to the reference exposure light intensity is calculated. Determination is made of whether an optical image of the mask pattern at the wafer plane can be formed or not according to the reference exposure light intensity, maximum exposure light intensity, minimum exposure light intensity, and the defocus amount. A pattern formation qualify/disqualify table is formed with the image formation qualify/disqualify data corresponding to the width and distance. The width of the interconnection and the distance between the interconnections of the semiconductor device are determined according to the pattern formation qualify/disqualify table. A mask of a pattern according to the determined interconnection width and distance is formed. By applying photolithography and processing using the mask, a predetermined conductive film formed on the semiconductor substrate is patterned.

According to the present method, the interconnection width and distance that allows formation of an optical image of the interconnection pattern are selected according to the table relative to the interconnection pattern. By applying a mask having an interconnection pattern based on the selected interconnection width and distance, a photoresist pattern corresponding to the interconnection pattern is formed. By processing the conductive film with the photoresist pattern as a mask, an interconnection pattern having a desired interconnection width and distance can be formed accurately on a semiconductor substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 28(a), 28(b), and 28(c) show the light path of diffracted light in normal illumination, and FIGS. 28(d), 28(e), and 28(f) show an optical image corresponding to (a), (b), and (c), respectively.

FIGS. 29(a), 29(b), and 29(c) show the light path of diffracted light in modified illumination, and FIGS. 29(d), 29(e), and 29(f) show an optical image corresponding to (a), (b), and (c), respectively.

FIGS. 36(a), 36(b), and 36(c) are diagrams showing the light path of diffracted light of annular illumination, and FIGS. 36(d), 36(e) and 36(f) show an optical image corresponding to (a), (b) and (c), respectively, for describing conventional problems.

DESCRIPTION OF THE PREFERRED EMBODIMENTS

First Embodiment

A pattern determination method according to a first embodiment of the present invention will be described hereinafter with respect to the drawings. In designing a device pattern, it is necessary to note the interconnection, and also ascertain whether an optical image of that interconnection pattern can be formed or not. It is convenient to generate a table for determining whether an optical image can be formed or not.

A method of generating such a table will be described with reference to the flow chart of FIG. 1 corresponding to a simulation including intensity distribution calculation of exposure light to generate a table.

Figure 1:
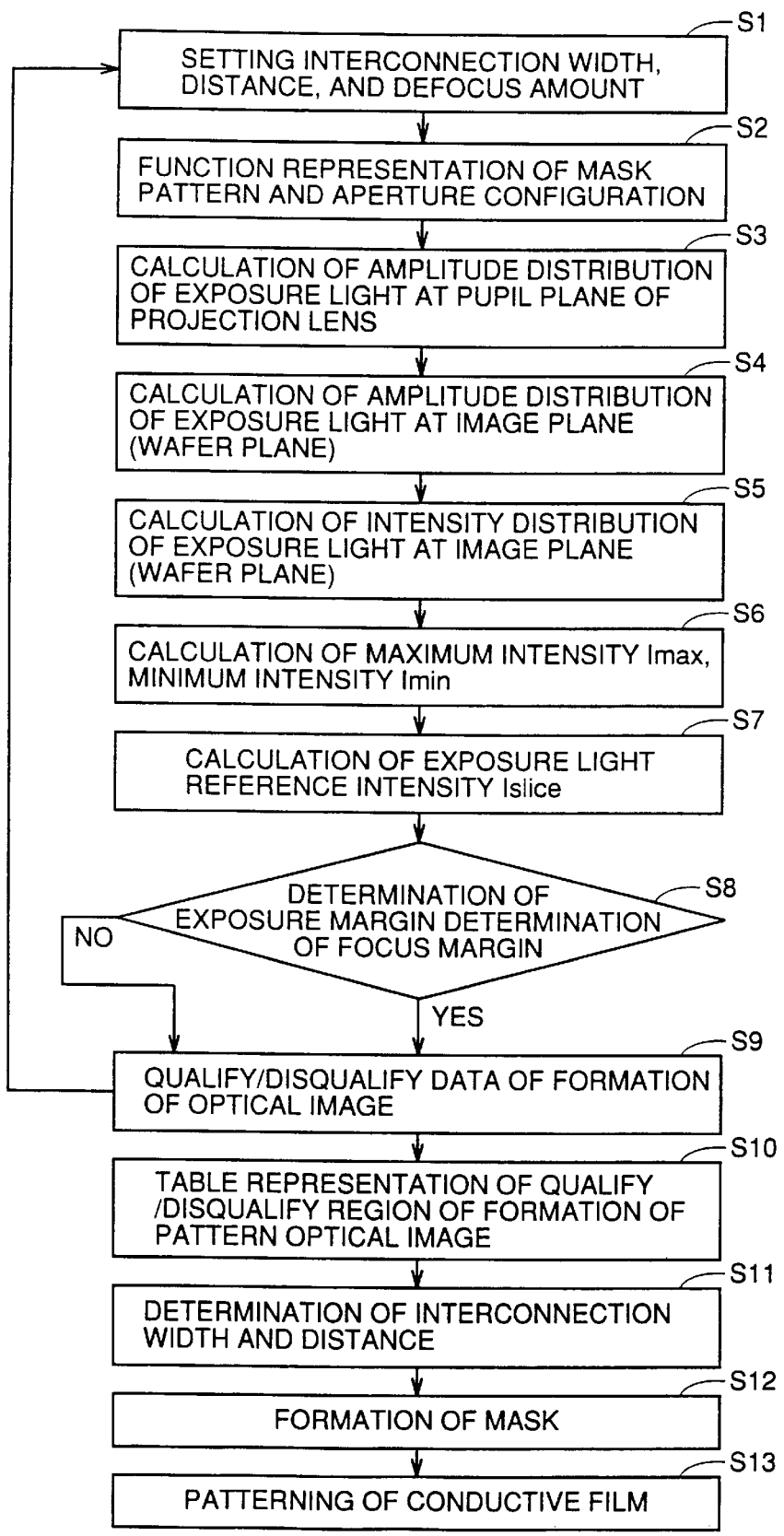
FIG. 1 is a flow chart of a simulation for generating a table used in the method of determining an interconnection pattern according to a first embodiment of the present invention.
Figure 27:
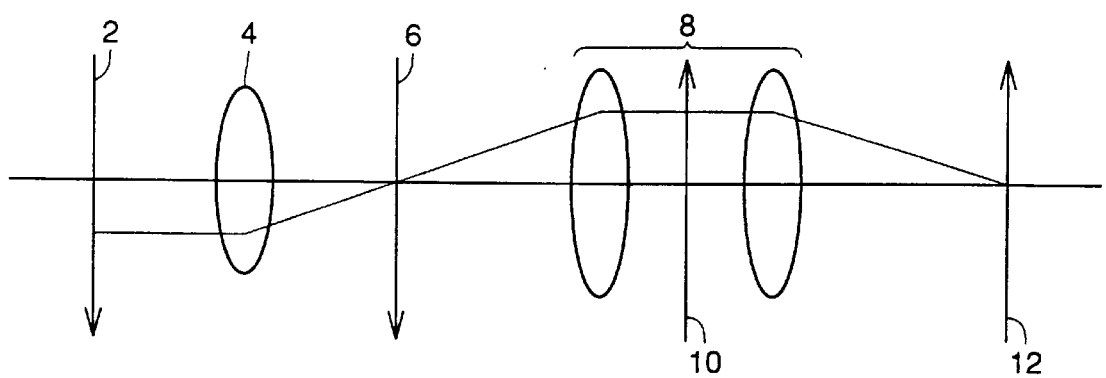
FIG. 27 is a diagram showing an optical system of an exposure apparatus.
Figure 30:
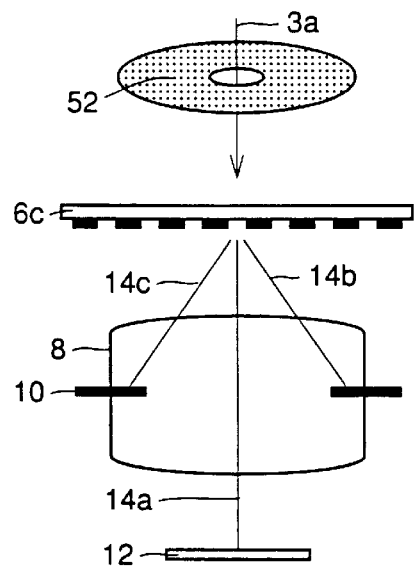
FIG. 30(a) shows the light path of diffracted light of exposure light incident perpendicular to a mask.
FIG. 30(b) shows an optical image thereof.
Figure 30:
Figure 31:
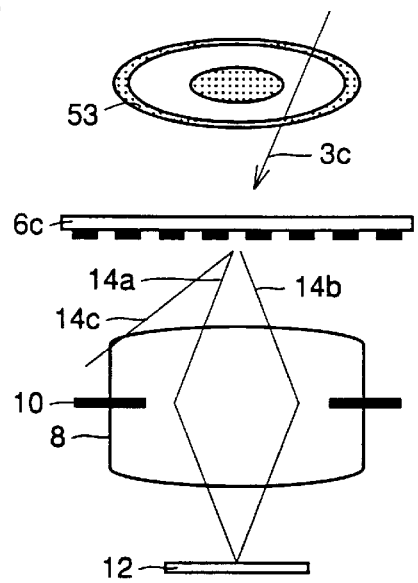
FIG. 31(a) shows the light path of diffracted light of exposure light incident oblique to a mask.
FIG. 31(b) shows an optical image thereof.
Figure 31:
Figure 32:
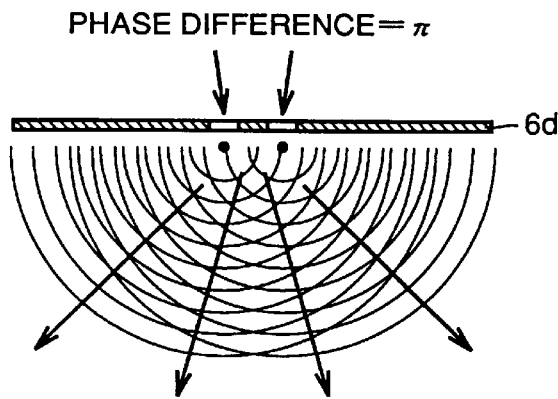
FIG. 32 shows interference of exposure light having a phase difference of $\pi$.
Figure 33:
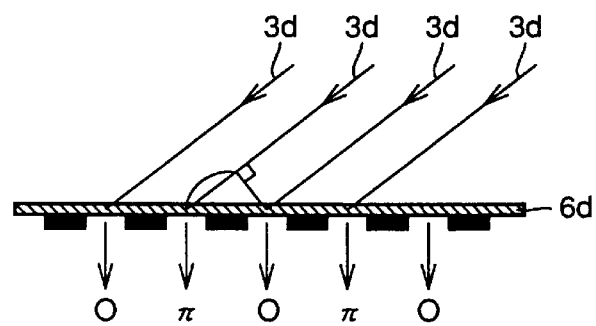
FIG. 33 is a sectional view showing a method of directing exposure light to generate a phase difference of FIG. 34 is a sectional view of a phase shift mask for generating a phase difference of $\pi$.
Figure 34:
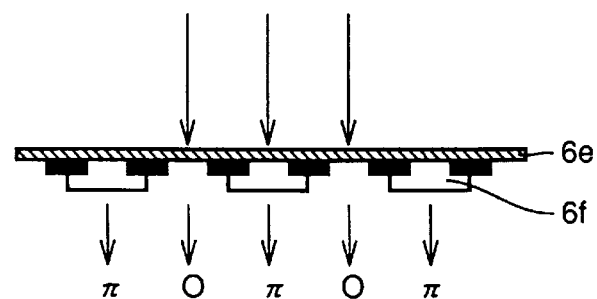
Figure 35:
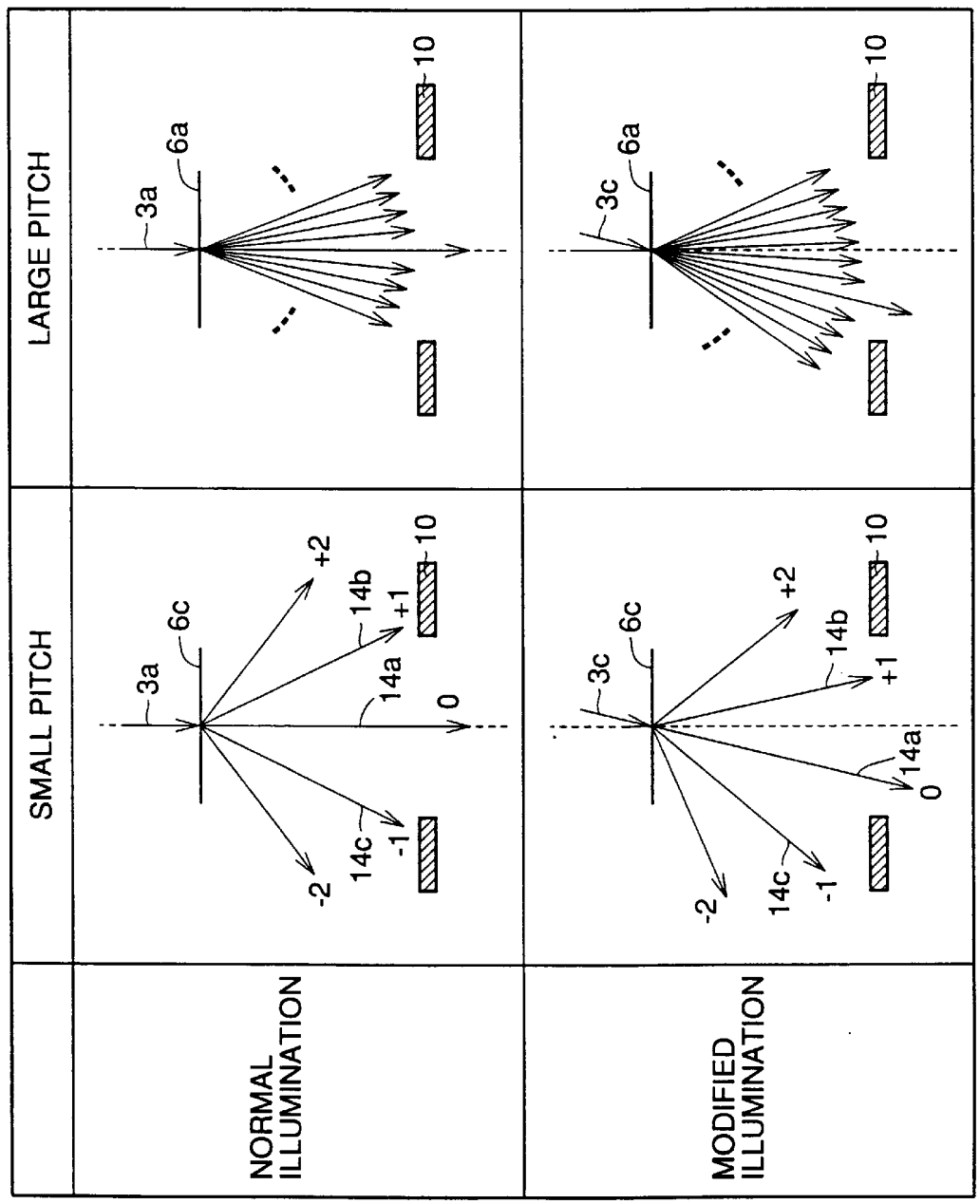
FIG. 35 shows the feature of normal illumination and modified illumination with respect to a pitch size.
Figure 37:
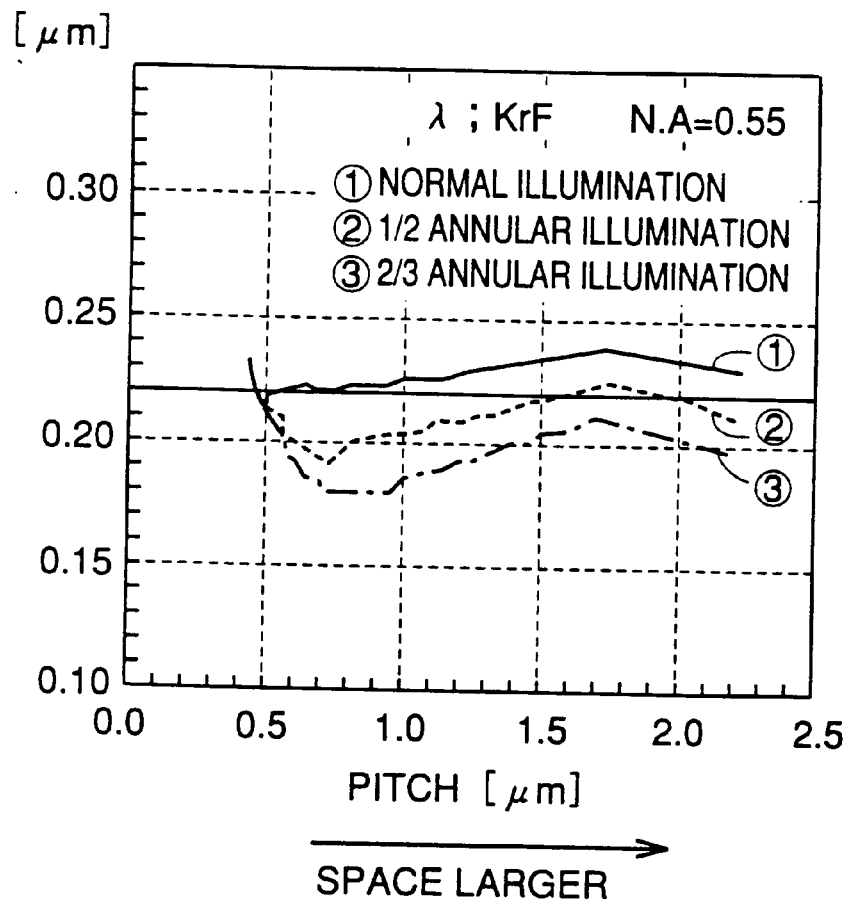
FIG. 37(a) is a graph showing change in the interconnection dimension due to light proximity effect.
FIG. 37(b) is a plan view showing an interconnection pattern thereof for describing conventional problems.
Figure 37:
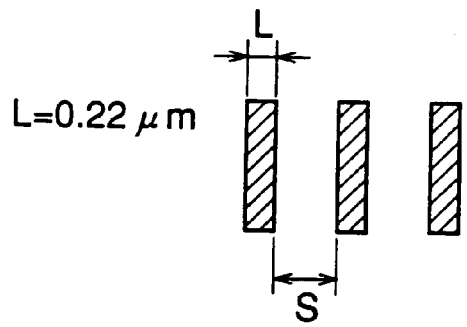

Referring to FIGS. 1 and 27, the width of an interconnection, the distance between interconnections, and the amount of defocus are set at step S1. At step S2, the pattern of a mask according to the interconnection width and the like is represented as a function. Also, the configuration of an aperture for directing predetermined exposure light from fly eye lens 2 (light source plane) to mask 6 is represented as a function.

At step S3, the amplitude distribution of exposure light emitted from fly eye lens 2 (light source plane) to pass through the aperture and diffracted by the pattern of mask 6 at pupil plane 10 of projection lens 8 is calculated. The diffracted exposure light is Fourier-transformed by projection lens 8. The transformation image is formed on pupil plane 10.

At step S4, the amplitude distribution of the diffracted exposure light at image plane 12 (wafer plane) is calculated. At image plane 12, the transformation image is inverse-Fourier-transformed. At step S5, the exposure light intensity distribution is calculated by the exposure light amplitude distribution at image plane 12. The exposure light intensity distribution is proportional to a square of the amplitude distribution.

At step S6, the maximum intensity Imax or the minimum intensity Imin of the exposure light intensity is calculated. Here, the maximum intensity Imax or the minimum intensity Imin implies the maximum intensity or minimum intensity for respective cases of just-focus and defocus states.

At step S7, the reference intensity Islice of the exposure light that allows the interconnection width and distance of a predetermined finish dimension is calculated. This reference intensity I becomes the reference of determining whether an optical image of the pattern of mask 6 can be formed or not on image plane 12.

That determination is made at step S8. At step S8, the exposure margin and focus margin are determined.

Figure 2:
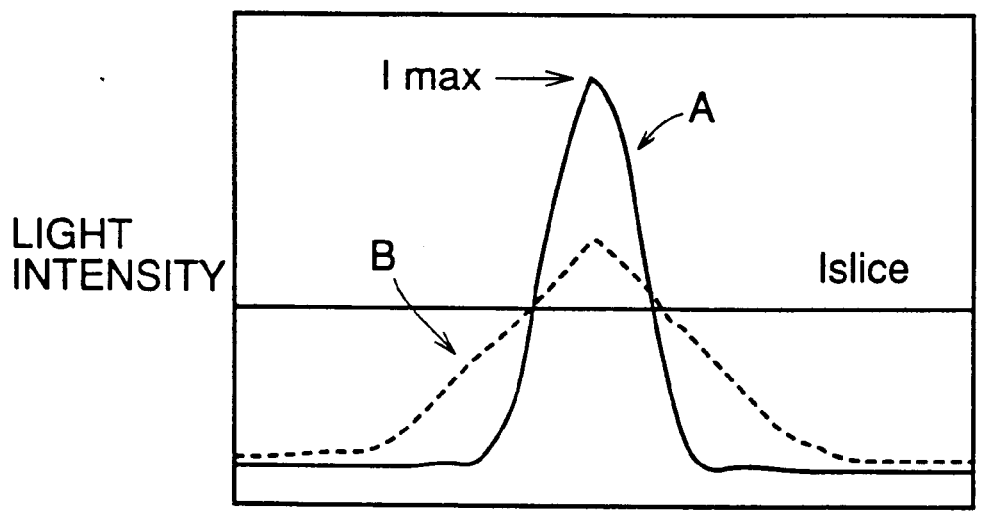
FIGS. 2 and 3 are diagrams for describing determination of exposure margin of the first embodiment.

Determination of exposure margin is first described. In the actual exposure process, the amount of exposure towards a resist is varied due to various factors such as defocus even when the amount of exposure from the exposure apparatus is constant. For example, FIG. 2 shows the intensity distribution at the image plane of exposure light passing through a mask having an independent transmission line as a pattern. Maximum intensity Imax of exposure light is greatest at A when in a just-focus state.

In the case of B where defocus occurs, the maximum intensity Imax is lower than that of case A. Any intensity greater than a certain value can contribute to image formation. It is estimated from experiments and the like that intensity of at least 1.5 times the reference intensity Islice is required as the maximum intensity.

Therefore, the value of Imax/Islice is calculated. Determination is made whether that calculated value is at least 1.5 or not (first condition).

Figure 3:
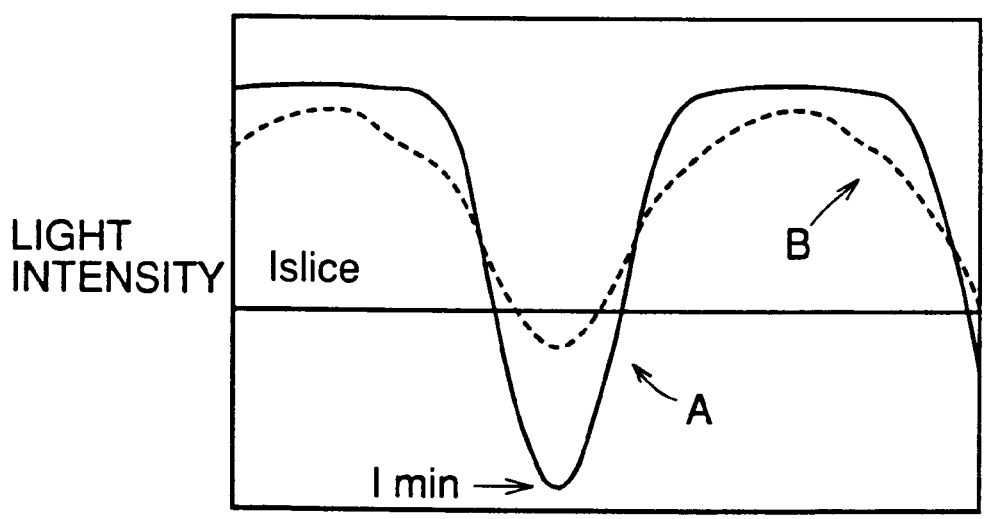

FIG. 3 shows the intensity distribution at the image plane of exposure light transmitted through a mask having an independent block line as a pattern. The minimum intensity Imin of the exposure light is smallest when in the case of A corresponding to a just-focus state. In the case of B corresponding to a defocus state, the minimum intensity Imin is greater than that of the case of A. Even though this minimum intensity increases, any minimum intensity can contribute to image formation as long as it is lower than a certain intensity value. It has been estimated from experiments and the like that the required minimum intensity is not more than 0.67 (1/1.5) times the reference intensity Islice.

Thus, the value of Imin/Islice is calculated. Determination is made whether that calculated value is equal to or less than 0.67 times (second condition).

Figure 4:
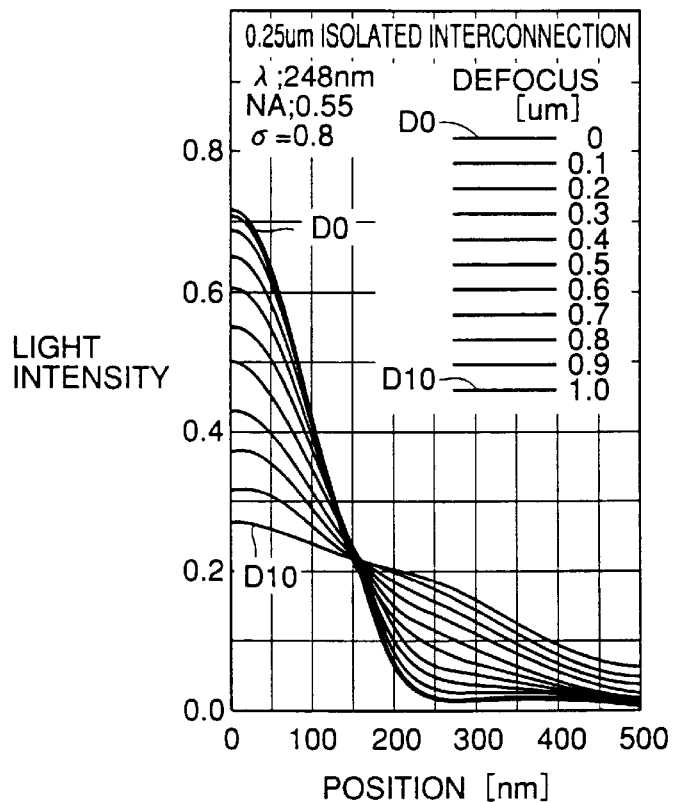
FIGS. 4 and 5 are diagrams for describing determination of focus margin of the first embodiment.
Figure 5:
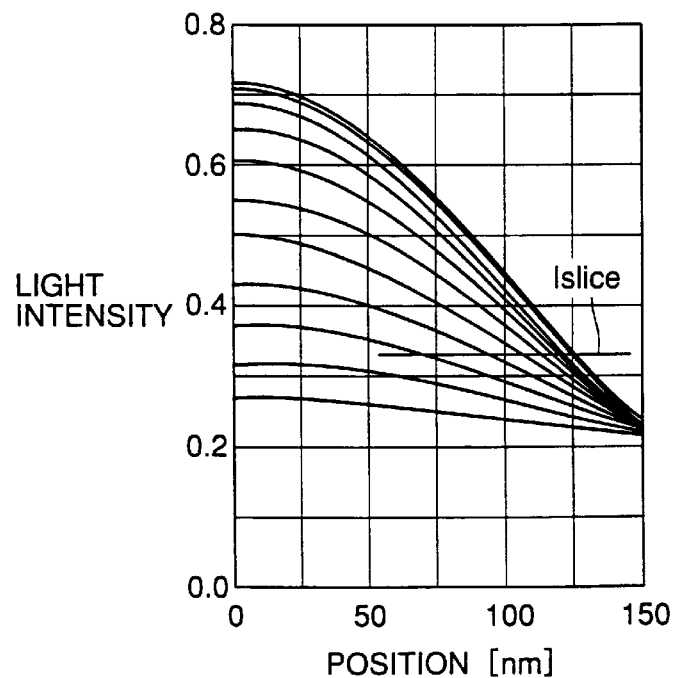

Determination of focus margin will be described hereinafter. As mentioned previously, the amount of exposure to a resist is altered by defocus. FIG. 4 shows the intensity distribution at an image plane of exposure light when the amount of defocus is altered in the case of FIG. 2. The abscissa indicates the distance from the position corresponding to the edge of a transmission line pattern. The width of the transmission line is set to 0.25 µm. FIG. 5 is a partial enlargement of FIG. 4.

It is appreciated from FIGS. 4 and 5 that the intensity of the exposure light is reduced as the amount of defocus increases from 0 µm (D0) to 1.0 micron (D10). Therefore, the finish dimension of the actual pattern is varied.

The tolerable range of pattern dimension variance is determined in advance. As shown in FIG. 5, the finish dimension for each amount of defocus is obtained for reference intensity Islice. The corresponding greatest defocus amount D out of the finish dimension within the tolerable range is obtained. Since there is a possibility of the focus being shifted upwards or downwards as to the image plane in a defocus state, the actual amount of defocus is two times the value of the obtained defocus amount D.

However, an image cannot be formed even with the obtained defocus amount 2D if it is not greater than the depth of focus DOF determined depending upon the exposure apparatus, the wafer, and the like. Therefore, determination is made whether the value of defocus amount 2D is greater than the depth of focus DOF (third condition).

Thus, for the case where all the first to third conditions are satisfied, determination is made that an optical image of the line and space pattern can be formed on an image plane at step S8. When any one of the first to third conditions is not satisfied, determination is made than an optical image of that line and space pattern cannot be formed on the image plane.

The qualify/disqualify data of optical image formation obtained at step 8 is stored corresponding to the interconnection width and distance at step S9. The above-described series of calculation is carried out with the interconnection width and distance as a variable. The qualify/disqualify data of formation of an optical image for each case is stored.

At step S10, a table is generated and displayed having the data obtained at step S9 corresponding to the interconnection width and distance.

Figure 6:
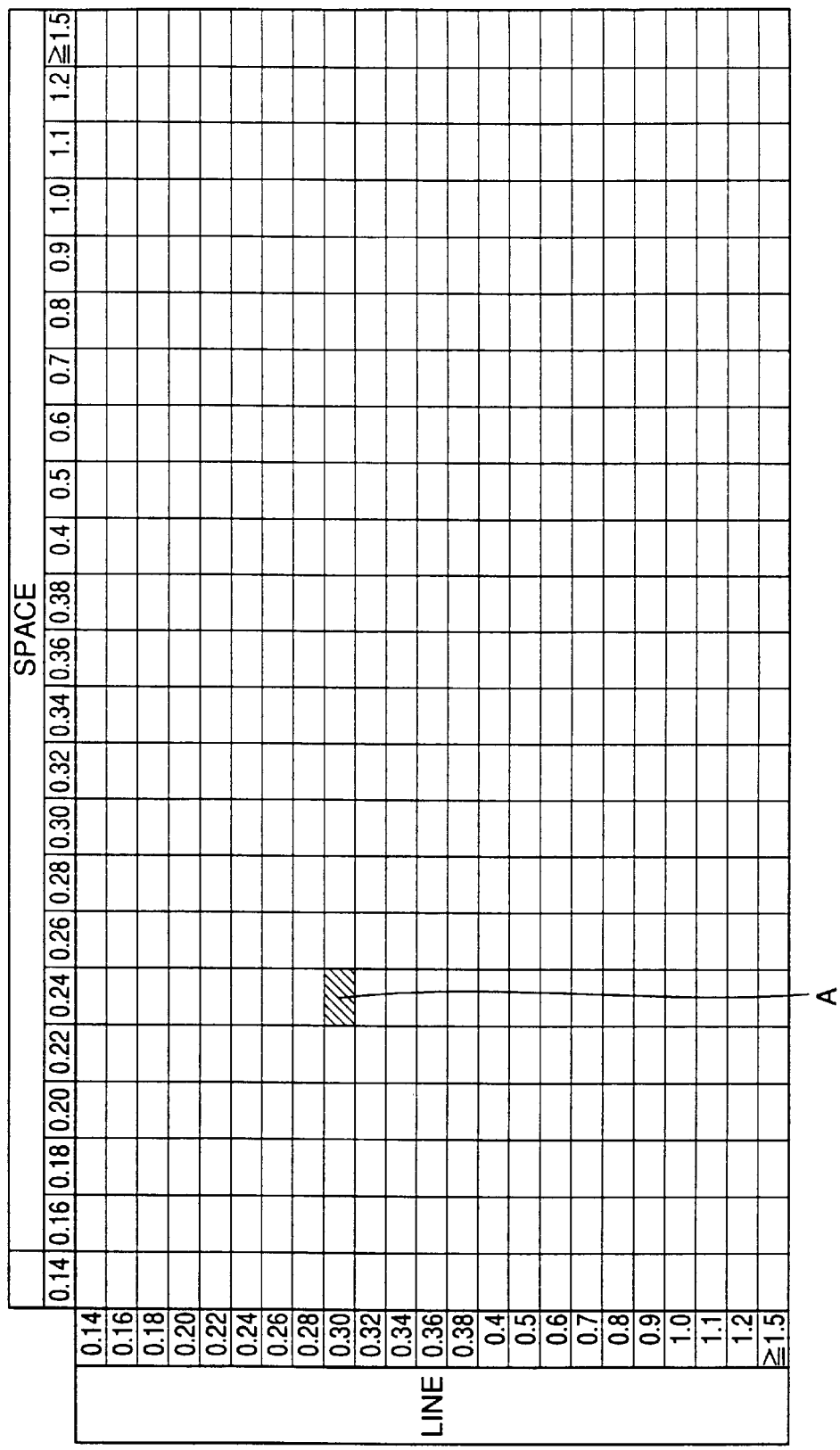
FIG. 6 shows an example of a table of the first embodiment.

The results obtained by the above simulation will be described hereinafter. An example of a table for providing a display of data is shown in FIG. 6. In this table, the vertical direction represents the width of a line (interconnection), and the horizontal direction represents the space. For example, shaded region A represents the line width range of 0.30 µm to 0.32 µm, and space from 0.24 µm to 0.26 µm.

Figure 7:
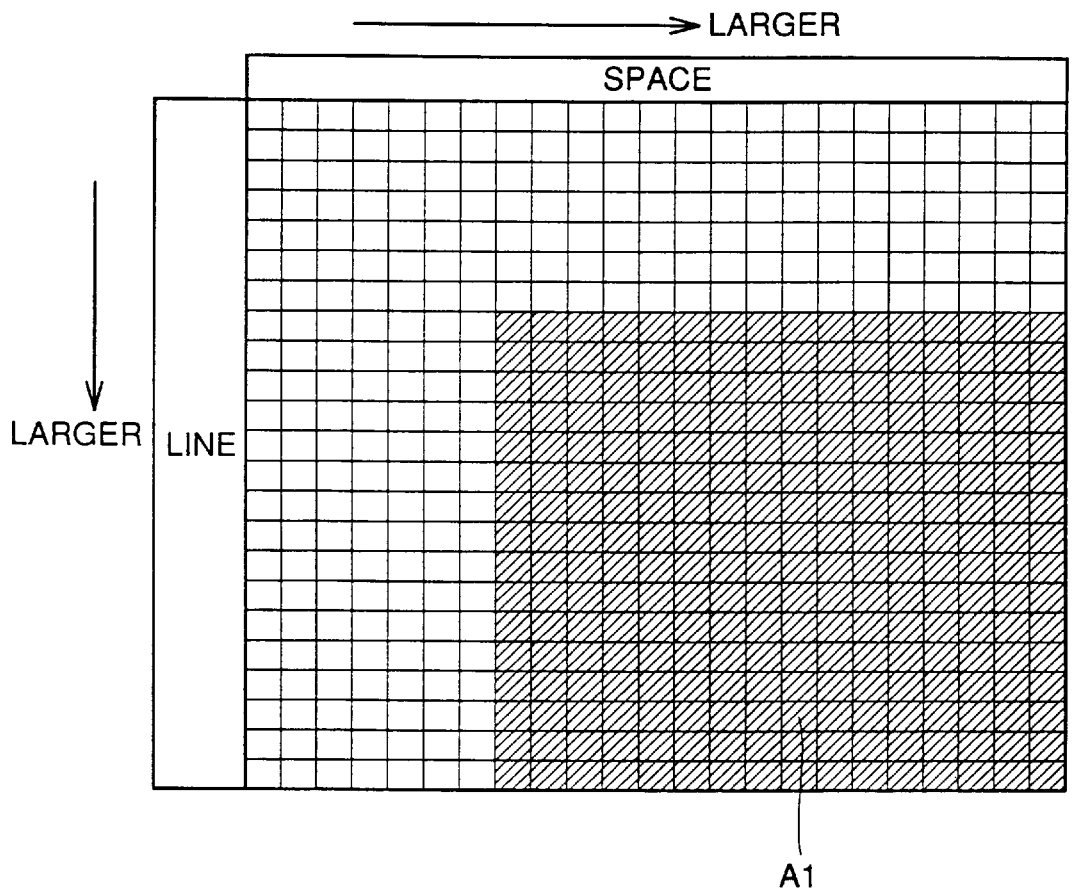
FIG. 7 shows calculation results of a simulation of the first embodiment.

The calculation result when an aperture for normal illumination is set is shown in FIG. 7. In the case of an aperture for normal illumination, the region allowing formation of an optical image of a line and space pattern on the image plane is the shaded area of region A1. More specifically, formation is allowed of an optical image for a pattern of a line having a width greater than the minimum line width and space larger than the minimum space.

It is estimated that the minimum line width and minimum space are approximately 0.3 µm respectively when the wavelength λ of exposure light is set to 248.7 nm, numerical aperture NA set to 0.55, and sigma (σ) set to 0.8, for example. The sigma represents the size of the illumination system when the value of numerical aperture NA of the projection lens is set to 1.

Figure 8:
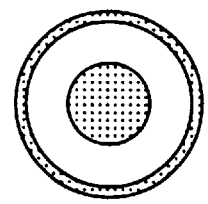
FIG. 8 is a plan view of an aperture applied in the simulation of the first embodiment.
Figure 9:
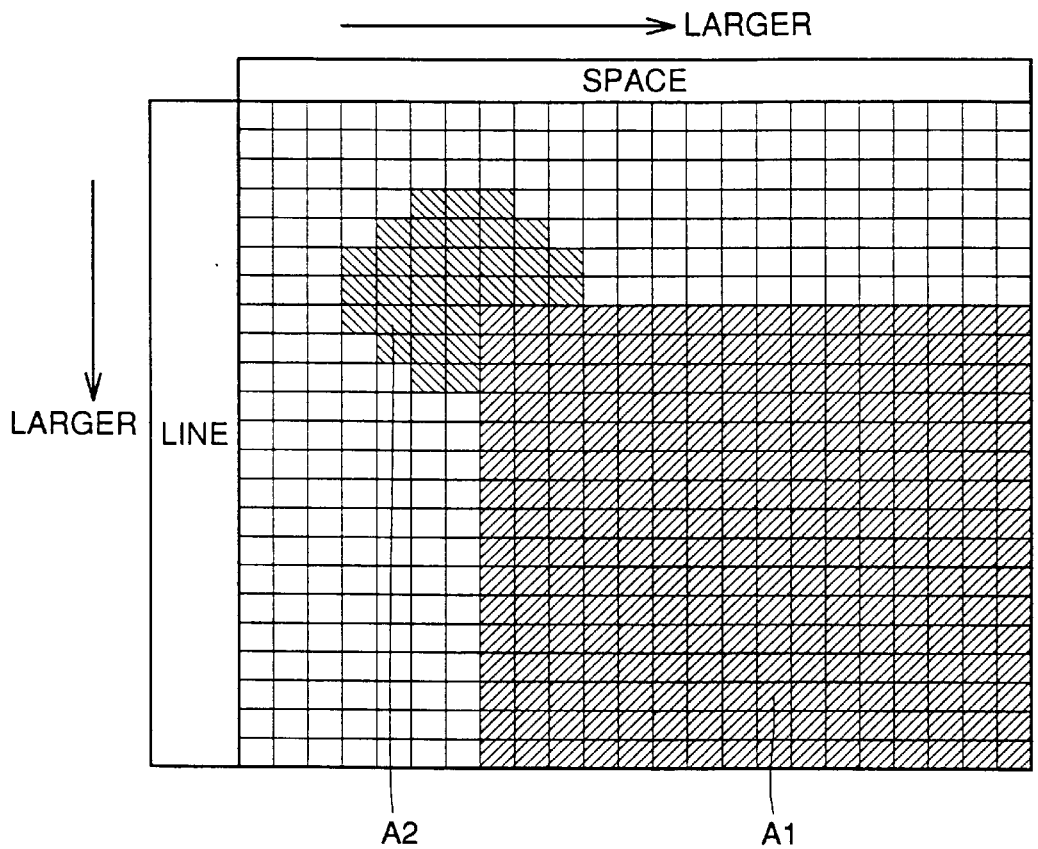
FIG. 9 shows another calculation results of by a simulation of the first embodiment.

The calculation result when the aperture for annular illumination of FIG. 8 is set is shown in FIG. 9. When the aperture for annular illumination is used, the region that allows formation of an optical image corresponds to region A1 plus region A2. As described before, the exposure light is directed oblique to the mask, so that the zero order diffracted light and first order diffracted light pass through the pupil plane. By interference therebetween, formation of an optical image is allowed.

Since determination of whether an optical image of a line and space pattern can be formed or not is facilitated by the table shown in FIG. 9, the present table becomes the basis for determination effective in determining the interconnection width and the interconnection distance of a semiconductor device.

Figure 10:
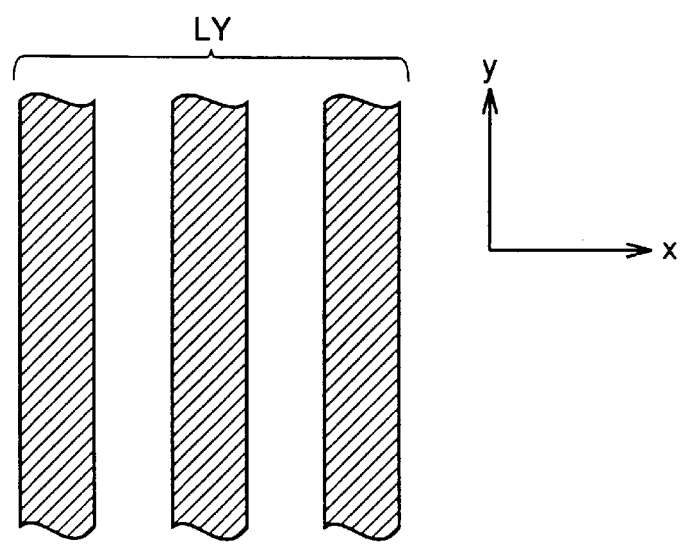
FIGS. 10 and 11 are diagrams for describing disadvantages of the aperture for annular illumination of the first embodiment.

The aperture for annular illumination has the disadvantage that the boundary (range) of region A2 shown in FIG. 9 cannot be specified definitely. This will be described according to an exemplary pattern shown in FIG. 10 with a pattern LY of a line and space parallel to the y axis. The y axis and the x axis orthogonal thereto match the direction of translation of the stage of the exposure apparatus on which the wafer is mounted. More specifically, they match the direction of translation of the image plane.

Figure 11:
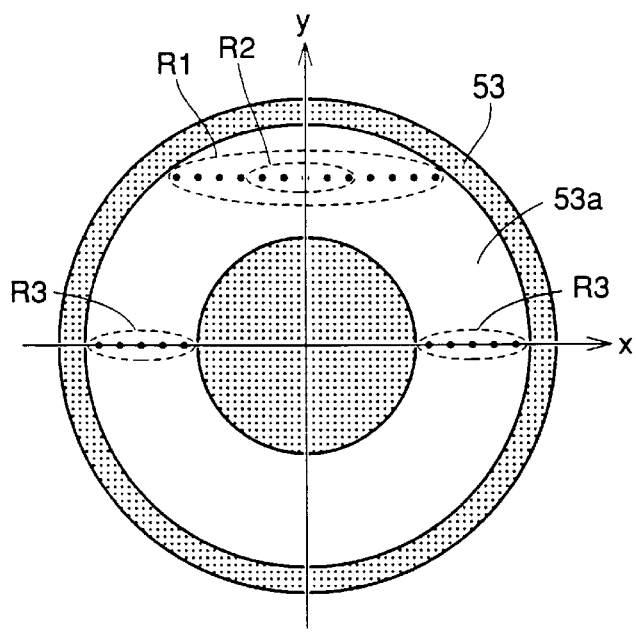

As shown in FIG. 11, exposure light passes through an opening 53a in an aperture 53 of annular illumination. Assuming that opening 53a is a group of point light sources, the coordinates thereof are set as (x, y). In the case of a line and space pattern parallel to the y axis, the row of point light sources arranged in the direction of the y axis do not affect the resolution of the pattern. The row of point light sources arranged in the direction of the x axis affect the pattern resolution. Assuming that P is the pitch of the line and space pattern from which an optical image of optimum resolution is obtained by the point light source located at an arbitrary position $x_1$ in the x axis direction, $x_1$ is represented by the following equation.

$$x_1 = \kappa \lambda / P \text{ (κ is a coefficient)}$$

Therefore, a point light source located farther away from the y axis contributes to the resolution of a pattern having a smaller pitch.

When focusing on a row of point light sources aligned in the direction of the x axis, there is a group of point light sources R1 including a group of point light sources R2, and a group of point line sources R3, for example, according to the position in the direction of the y axis. The group of point light sources R3 of the plurality of groups of point light sources can contribute to the resolution of a pattern having a smaller pitch since the value of the x coordinate is a relatively large value.

However, the group of point light sources R1 includes the group of point light sources R2 having a small value of the x coordinate. Therefore, the exposure light emitted from point light source R2 will degrade the resolution of the pattern of a small pitch.

Considering the point light sources of the entire opening 53a, the exposure light emitted from the point light source located in the proximity of the y axis degrades the resolution in the line and space pattern LY parallel to the y axis. As a result, the boundary of region A2 cannot be identified definitely. The same can be said for a line and space pattern parallel to the direction of the x axis.

Second Embodiment

The aperture for annular illumination had the disadvantage that the region in which an optical image of a fine line and space pattern can be formed becomes indefinite on the table. The second embodiment of the present invention provides an aperture having an opening of a configuration that overcomes this disadvantage, and a table obtained by this aperture.

Figure 12:
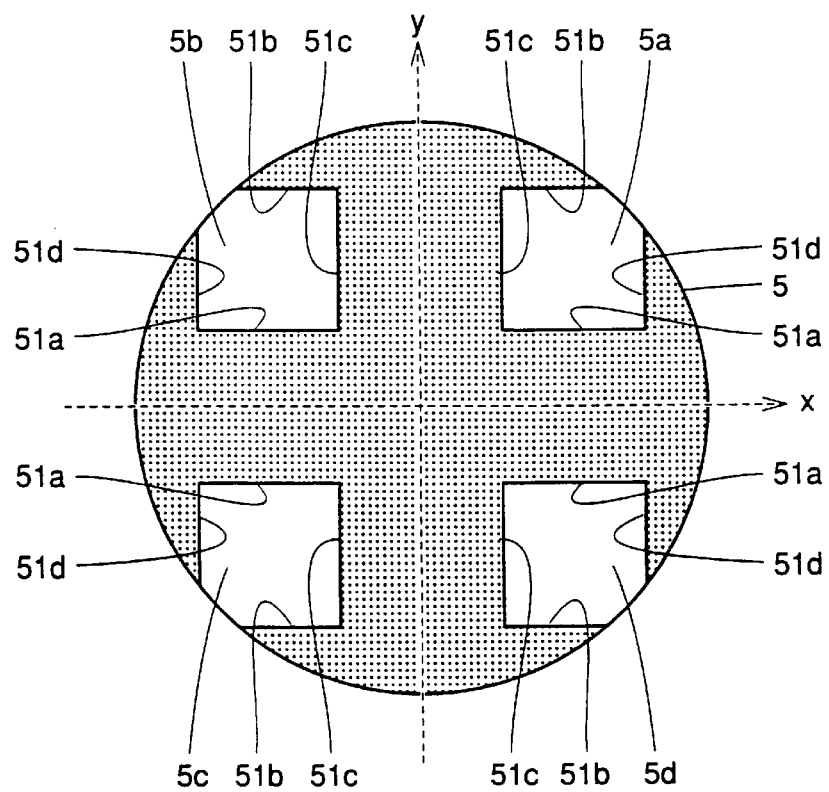
FIG. 12 is a plan view of an aperture including four openings applied to the simulation of a second embodiment of the present invention.

FIG. 12 is a plan view of an aperture having four openings 5a, 5b, 5c and 5d. Each of openings 5a, 5b, 5c and 5d has a closer side opening edge 51a and a remote side opening edge 51b respectively parallel to the x axis, and a closer side opening edge 51c and a remote side opening edge 51d respectively parallel to the y axis. The distance from the x axis to closer side opening edge 51a or remote side opening edge 51b is equal to the distance from the y axis to closer side opening edge 51c or remote side opening edge 51d.

Figure 13:
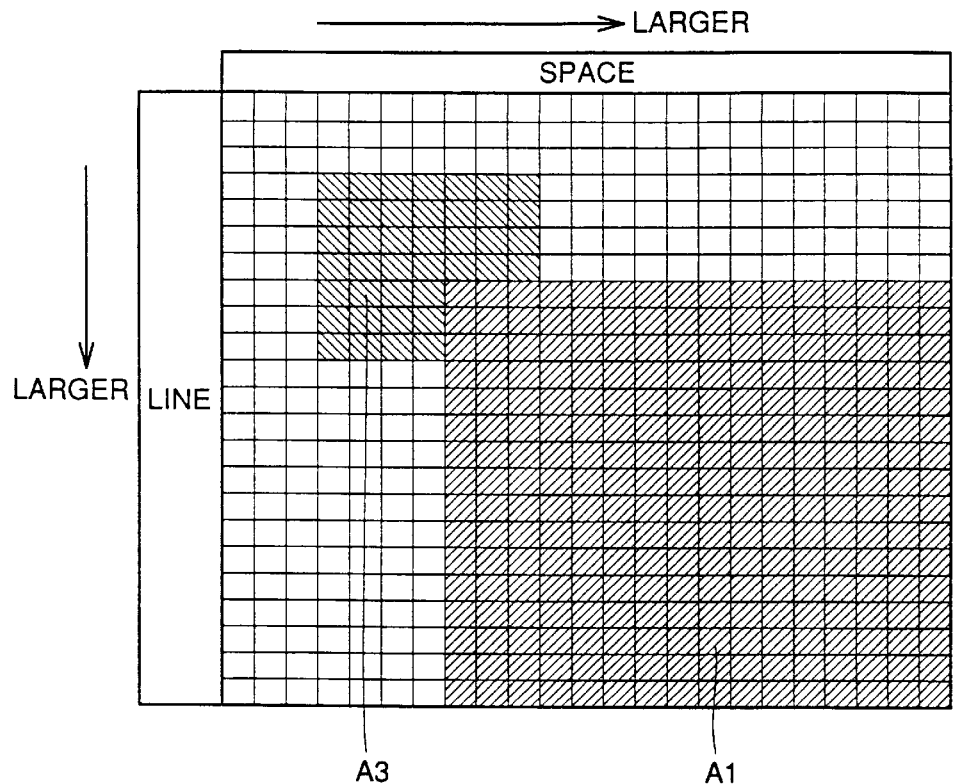
FIG. 13 shows calculated results when the aperture of FIG. 12 is applied according to the second embodiment.

A table obtained by a simulation with an aperture of the above-described configuration is shown in FIG. 13. According to aperture 5 of the second embodiment, the region in which formation of an optical image is allowed is region A1 plus region A3.

The minimum line width and minimum space of region A1 is estimated as approximately 0.3 $\mu$m respectively when wavelength $\lambda$ of exposure light is set to 248.7 nm, the numerical aperture NA is set to 0.55, the value of $\sigma$ corresponding to closer side opening edge 51a of aperture 5 is set to 0.22, and the value of $\theta$ corresponding to remote side opening edge 51b is set to 0.62. The minimum line width and minimum space of region A3 are estimated to be 0.2 $\mu$m respectively. The maximum line width and maximum space of region A3 are estimated to be approximately 0.5 $\mu$m respectively.

Comparing the configuration of region A3 represented on the table to the configuration of region A2 of FIG. 9, it is appreciated that region A3 is substantially rectangular. This will be described hereinafter according to a concept similar to that of FIG. 11.

Figure 14:
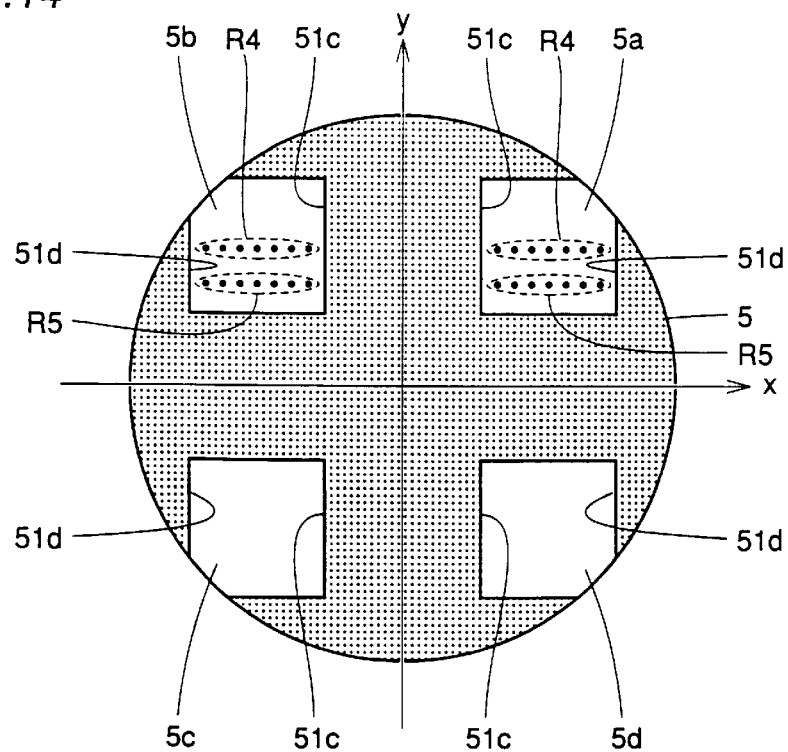
FIG. 14 is a diagram for describing the feature of the aperture of FIG. 12 according to the second embodiment.
Figure 15:
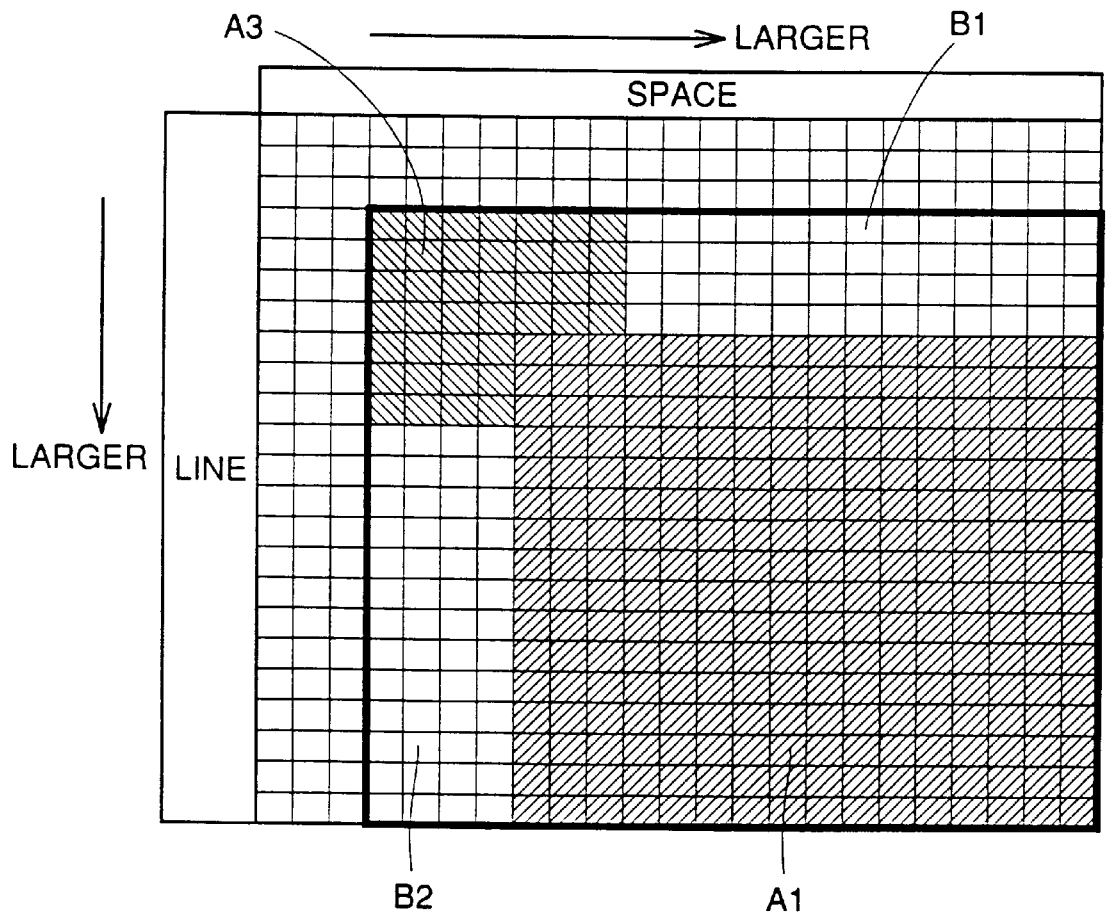
FIG. 15 is a diagram for describing the significance of table representation of a calculation result obtained by applying the aperture of FIG. 12 in the second embodiment.

As shown in FIG. 14, there are groups of point light sources R4 and R5 focusing on the row of point light sources arranged in the direction of the x axis. Closer side opening edge 51c and remote side opening edge 51d of each of openings 5a, 5b, 5c and 5d are respectively parallel to the y axis. Therefore, the exposure light is directed to the mask from a point light source located within a range spaced apart from the y axis by a constant distance, independent of the location in the direction of the y axis. In other words, any exposure light emitted from a point light source located within a range of a constant distance from the y axis is blocked to be prevented from arriving at the mask.

The exposure light emitted from a point light source located in the proximity of the y axis is directed to the mask according to aperture 53 of FIG. 11, whereas exposure light emitted from a point light source located within a constant range from the y axis according to aperture 5 is blocked and not directed to the mask. Therefore, degradation in the resolution of the fine line and space pattern parallel to the direction of the y axis can be prevented. The same can be said for a line and space pattern parallel to the direction of the x axis.

As described above, aperture 5 can prevent degradation in the resolution of a fine line and space pattern parallel to the y axis since exposure light emitted from a light source located in the proximity of the y axis is not included. In other words, the boundary of a region that allows formation of an image is rendered definite. As a result, the configuration of region 3 represented on a table is rectangular.

The rectangular shape of region A3 provides the advantage that, in a region B1 corresponding to a pattern having a line smaller than a constant width and space greater than a predetermined space, definite determination can be made of incapability of forming an optical image of the pattern thereof.

Definite determination can be made that an optical image cannot be formed of a pattern having a line greater than a predetermined width and space smaller than predetermined space that corresponds to region B2.

The application of the above obtained table into fabrication of a semiconductor device will be described hereinafter. Referring to FIG. 1 described in association with the first embodiment, the interconnection width and the distance between interconnections are determined at step S11 according to the table obtained at step S10. At step S12, a mask is formed having a pattern according to the determined interconnection width and distance. At step S13, the photoresist formed at the conductive film on the semiconductor substrate is subjected to photolithography, whereby a photoresist pattern is formed. Using this photoresist pattern as a mask, the conductive film is processed. As a result, an interconnection pattern is produced having a predetermined interconnection width and a predetermined interconnection distance.

According to the above method, a fine interconnection pattern of high dimension accuracy is formed. Therefore, the electrical characteristics of a semiconductor device can be stabilized. The above method is effective particularly in the case of forming an interconnection pattern for the bit line and word line of a dynamic random access memory described in the following embodiment.

Third Embodiment

In the previous second embodiment, determination is significantly facilitated of whether an optical image of a line and space pattern can be formed or not according to a table employing aperture 5.

A method of setting the configuration of an opening of such an aperture will be described hereinafter taking as an example the interconnection pattern of a memory cell region of a dynamic random access memory (referred to as "DRAM" hereinafter).

Figure 16:
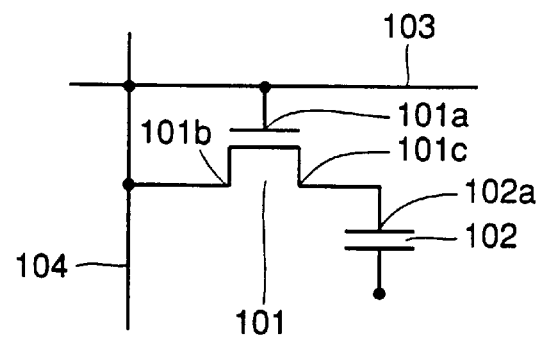
FIG. 16 is a circuit diagram equivalent to a memory cell of a DRAM as a semiconductor device that determines the interconnection pattern according to a third embodiment of the present invention.
Figure 17:
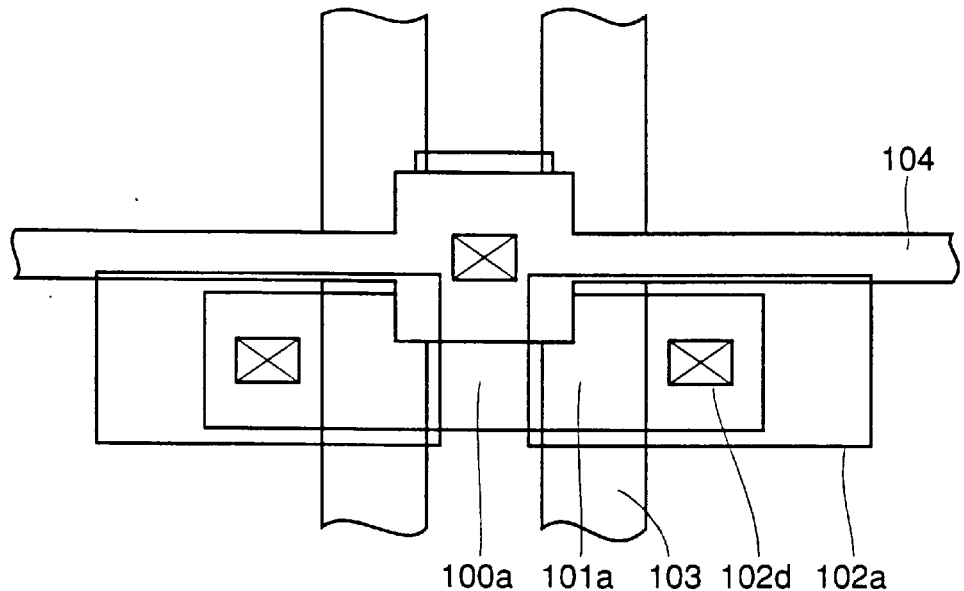
FIG. 17 is a plan view of a memory cell of a DRAM according to the third embodiment.
Figure 18:
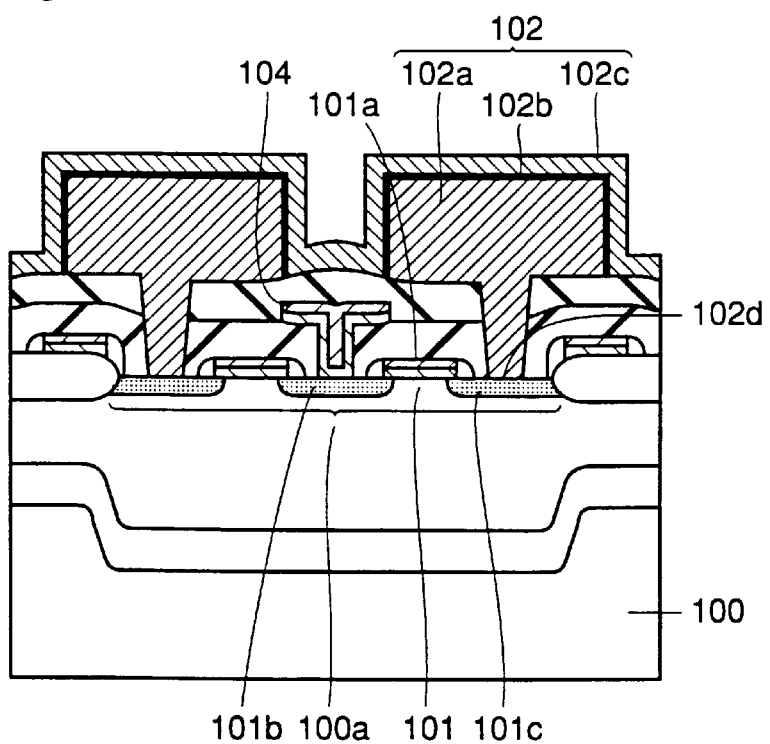
FIG. 18 is a sectional view of a memory cell of a DRAM of the third embodiment.

FIG. 16 shows an equivalent circuit of a DRAM memory cell. FIGS. 17 and 18 show a plan view and a sectional view of the memory cell region, respectively.

Referring to FIGS. 16–18, a DRAM memory cell includes a set of a MOSFET 101 and a capacitor element 102. MOSFET 101 includes a pair of source and drain regions 101a and 101b, which are formed at an active region 100a of a semiconductor substrate 100 surrounded by an element isolation oxide film. Capacitor element 102 includes a storage node 102a, a capacitor insulation film 102b, and a cell plate 102c.

Storage node 102a is electrically connected to a source-drain region 101c via a contact 102d. A bit line 104 is electrically connected to source•drain region 101b. MOSFET 101 has its gate electrode 101a electrically connected to a word line 103. Word line 103 is formed in a direction substantially orthogonal to bit line 104.

Figure 19:
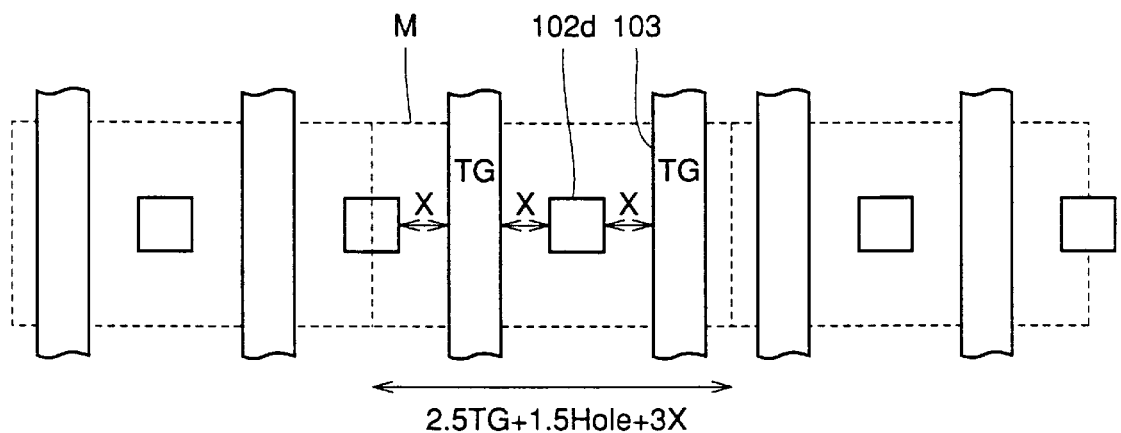
FIG. 19 is a plan view of a word line pattern of a memory cell region of a DRAM of the third embodiment.
Figure 20:
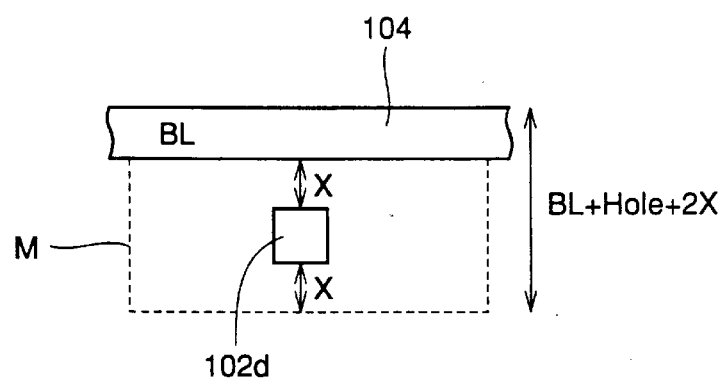
FIG. 20 is a plan view of a bit line pattern in a memory cell region of a DRAM of the third embodiment.

The pitch of a bit line and a word line that electrically connect each memory cell will be described hereinafter. FIG. 19 is a plan view of the pattern of word line 103 in a memory cell region together with storage node contact 102d. FIG. 20 is a plan view of the pattern of bit line 104 together with storage node contact 102d.

First, note the rectangular region M indicated by the dotted line in FIG. 19. This region M represents the region of the basic pattern of the repeated pattern of word line 103. The length of the longer side of region M is 2.5 TG+1.5 Hole+3X where X is the distance between the storage node contact and word line, TG the width of the word line, and Hole the diameter of the storage node contact. Two word lines 103 are formed orthogonal to this longer side.

In FIG. 20, note the region M of the bit line located at a position identical to that of region M of FIG. 19. The region M of FIG. 20 represents a region of the basic pattern of the repeated pattern of bit line 104. The length of the shorter side of region M is BL+Hole+2X where BL is the width of bit line 104. One bit line 104 is formed so as to be orthogonal to this shorter side.

Regarding the interconnection of the word line and the bit line in a DRAM, two lines are formed so as to be orthogonal to the longer side of the rectangle, and one line is formed so as to be orthogonal to the shorter side of the rectangle.

Compare the length of the longer side to the length of the shorter side of the rectangle. Regarding the width of the interconnection, the width of a word line is substantially identical to that of a bit line. Therefore, the length of the longer side is approximately two times the length of the shorter side. It is therefore appreciated that one line is formed so as to be orthogonal to the shorter side as an average in a DRAM. The length of the shorter side is the sum of the width of an interconnection and the distance between interconnections. In other words, the length of the shorter side corresponds to the pitch.

In patterning the interconnection of a DRAM, the exposure light must be directed to the mask so that the optimum resolution is obtained with respect to the pitch.

Consider the condition that provides the greatest depth of focus with respect to the interconnection pitch. This condition can be obtained from the relationship of:

$$\sin \alpha = \lambda/2P$$

where $\alpha$ is the incident angle of exposure light to the mask and P is the interconnection pitch.

It is therefore important to set the position of the opening in the aperture so that the angle of the exposure light directed to the mask includes the angle obtained by the above equation.

For example, the value of sigma ($\sigma$) is estimated to be 0.28 by the relationship of:

$$\sigma = \sin \alpha/NA$$

when the interconnection pitch P is 0.8 μm, X is 248 nm, and the numerical aperture NA is 0.55.

By employing the aperture having the position of the opening set according to the interconnection pitch, the resolution of the interconnection pattern is rendered optimum.

Fourth Embodiment

In the present fourth embodiment, a method of minimizing the width of the variation in the finish dimension of the interconnection width that varies due to light proximity effect will be described hereinafter.

Figure 21:
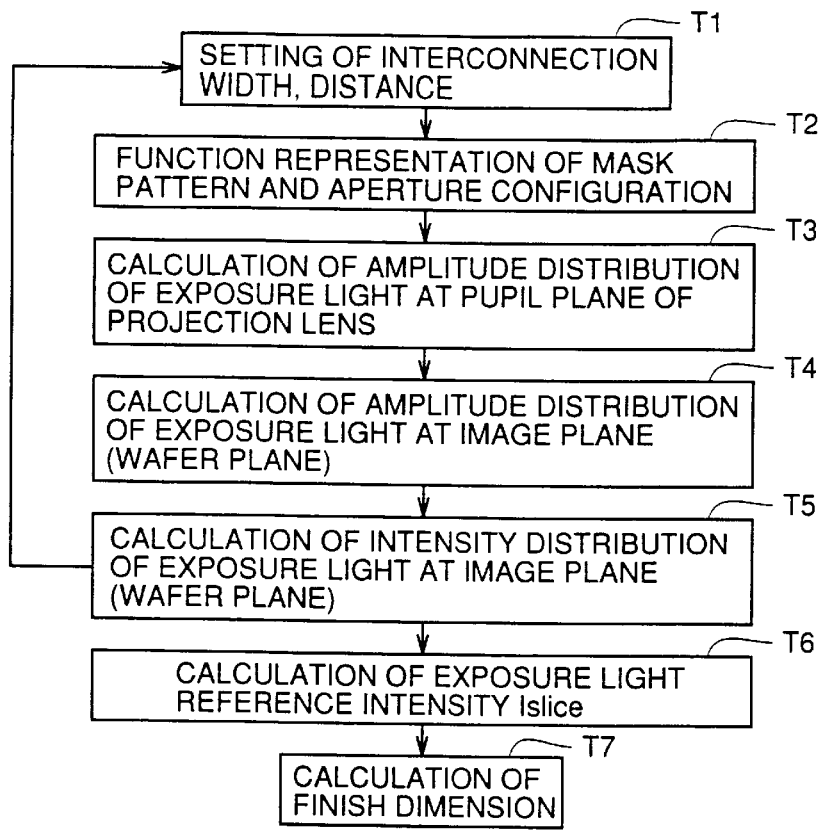
FIG. 21 is a flow chart of a simulation to obtain an interconnection finish dimension used to determine the opening configuration of the aperture according to a fourth embodiment of the present invention.

First, the method of obtaining the interconnection finish dimension will be described. FIG. 21 is a flow chart of the simulation for calculating the exposure light intensity and the simulation including light proximity effect.

At step T1 of FIG. 21, the interconnection width and the distance between interconnections are set.

Figure 22:
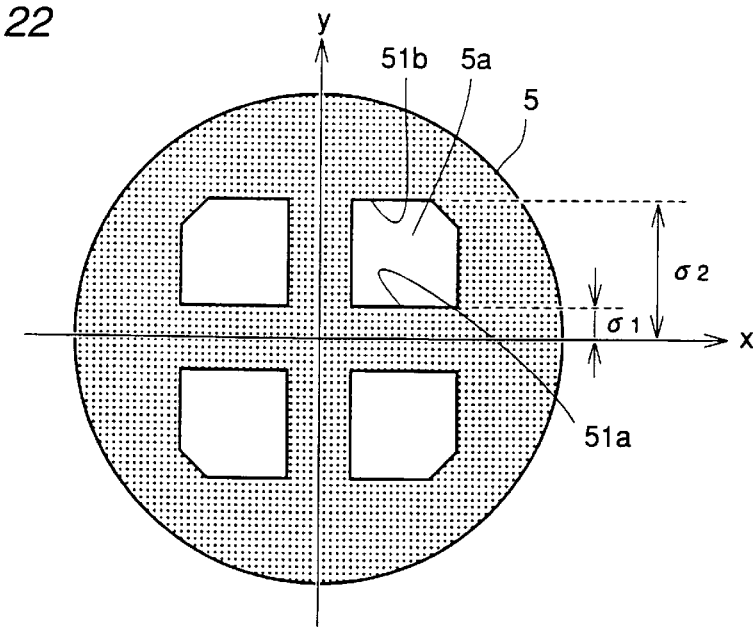
FIG. 22 shows the relationship of the position of the opening of the aperture applied in the simulation of the fourth embodiment.

At step T2, the pattern of a mask according to the width of the interconnection and the like is represented as a function. Also, the configuration of the aperture is represented as a function. Aperture 5 shown in FIG. 22 is set as the aperture in the present embodiment. Here, the sigma corresponding to closer side opening edge 51a of opening 5a is set as $\sigma_1$, and the sigma corresponding to remote side opening edge 51b is set as $\sigma_2$.

At step T3, the amplitude distribution at the pupil plane of the exposure light is calculated. At step T4, the amplitude distribution at the image plane of the exposure light is calculated. At step T5, the intensity distribution of the exposure light at the image plane is calculated. The above-mentioned series of calculation are carried out with the interconnection width, interconnection distance, and aperture configuration as variables.

At step T6, the reference intensity Islice of the exposure light that allows the interconnection of a width and distance exactly as the design dimension is calculated. At step T7, the finish dimension of other interconnection width are calculated according to reference intensity Islice.

Figure 23:
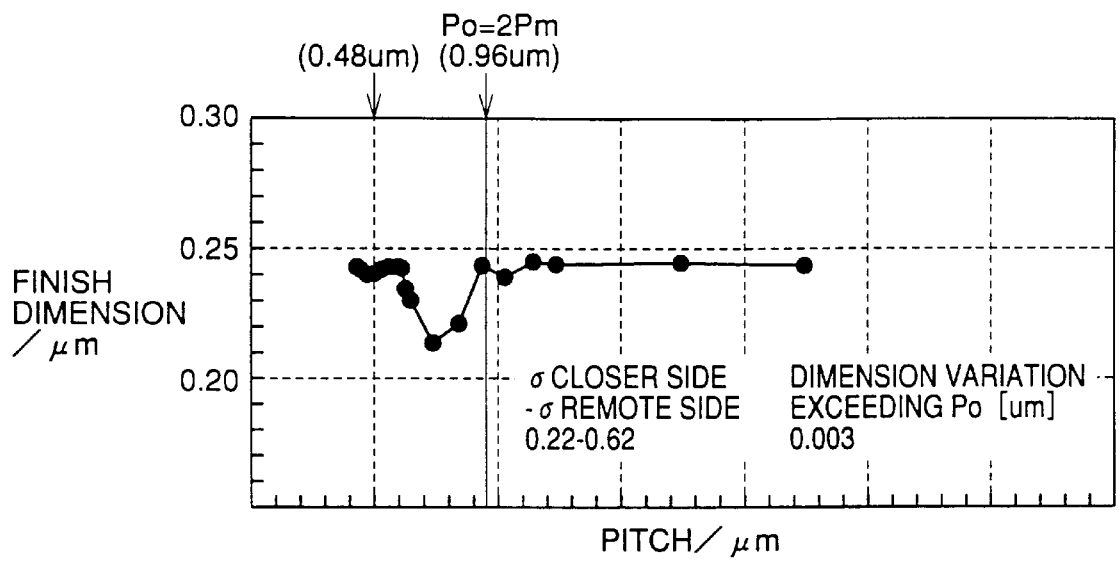
FIGS. 23, 24 and 25 show results obtained by the simulation of the fourth embodiment.
Figure 24:
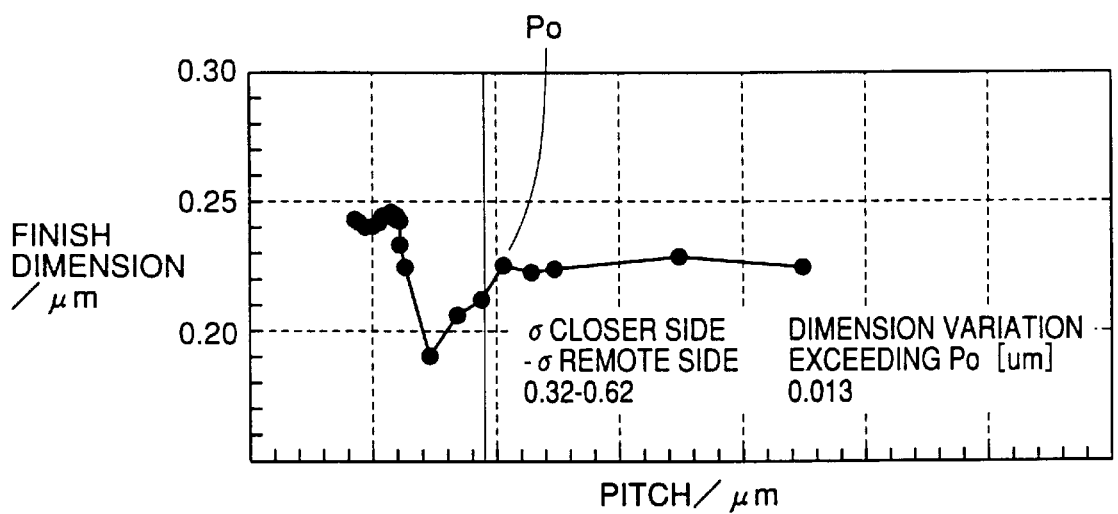
Figure 25:
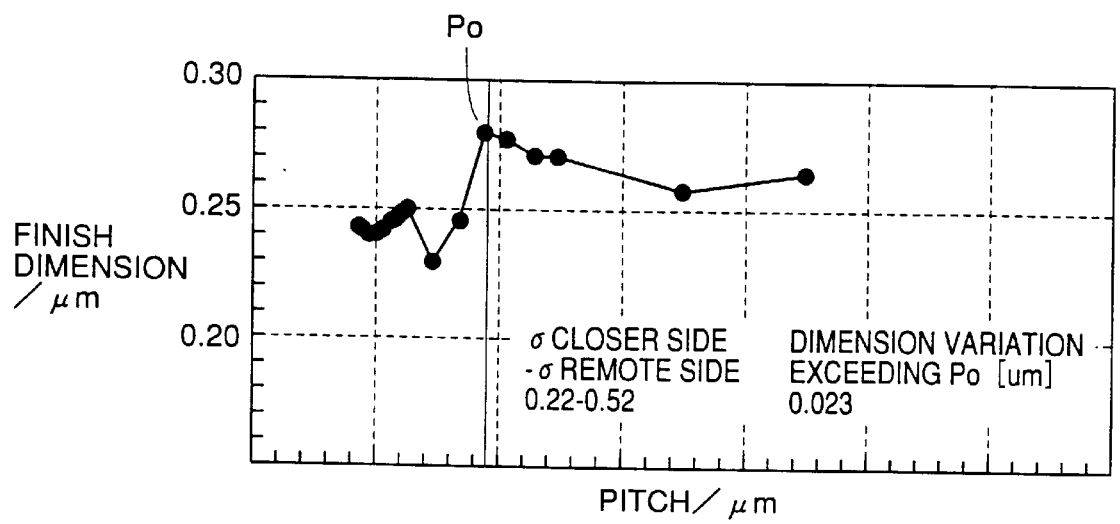

The result obtained by the above simulation will be described with reference to FIGS. 23–25 indicating the finish dimension of the interconnection width when the interconnection distance is altered with a constant interconnection width. The interconnection width is set to 0.25 μm. The minimum pitch is set to 0.48 μm. In FIGS. 23, 24, and 25, the values of $\sigma_1$ and $\sigma_2$ are set to 0.22 and 0.62, 0.32 and 0.62, and 0.22 and 0.52, respectively.

It is appreciated from FIGS. 23–25 that the value of the finish dimension is reduced by the light proximity effect as the pitch increases from the minimum pitch. Variation in the finish dimension is small when the pitch is greater than a certain pitch (this pitch is referred to as $P_0$). It is therefore preferable to set the value of pitch $P_0$ as low as possible from the standpoint of suppressing variation in the finish dimension.

Pitch $P_0$ is rendered smaller by reducing the value of $\sigma_1$ in comparison of FIGS. 23 and 24. In other words, the value of pitch $P_0$ becomes smaller by setting the position of the closer side opening edge of aperture 5 closer to the x axis.

However, setting the closer side opening edge in the proximity of the x axis will cause the exposure light passing through the neighborhood of the x axis to be directed to the mask. As a result, the resolution of the line and space pattern will be degraded as described before. The value of $\sigma_1$ must be determined so that the value of pitch $P_0$ is minimized within a range that will not degrade the resolution.

It is appreciated from the comparison of FIGS. 23 and 25 that the difference between the finish dimension and the design dimension for a pitch greater than pitch $P_0$ becomes larger in response to the value of $\sigma_2$ even when the value of $\sigma_1$ is the same. It is therefore necessary to determine the values of $\sigma_1$ and $\sigma_2$ so that the dimension difference is minimized with respect to various combinations of $\sigma_1$ and $\sigma_2$.

In view of the foregoing, FIG. 23 shows the results for optimum $\sigma_1$ and $\sigma_2$. It was found that the value of pitch $P_0$ is approximately two times the minimum pitch of 0.48 μm in this case. Also, the difference between the finish dimension and the design dimension is estimated to be 0.003 μm for a pitch greater than pitch $P_0$ (0.96 μm). This value of the dimension difference is one order of magnitude smaller than the case shown in FIGS. 24 and 25. A finish dimension more closer to the design dimension can be achieved.

By setting the optimum configuration of the aperture opening, the light proximity effect can be minimized for an interconnection pattern having a pitch greater than two times the minimum pitch. As a result, a pattern of an interconnection having a desired width can be formed.

A specific example of such an interconnection pattern will be described focusing on a DRAM interconnection pattern.

Figure 26:
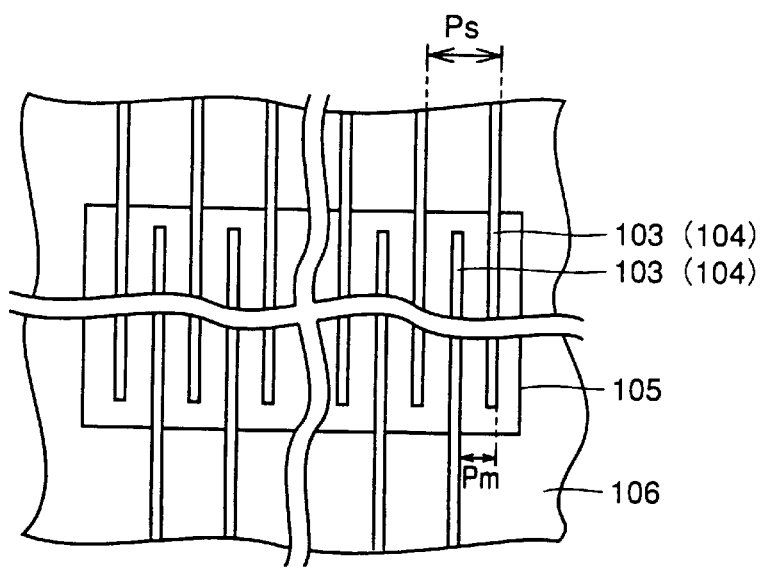
FIG. 26 is a plan view showing an interconnection pattern at a peripheral region of a DRAM.

As described in the previous third embodiment, the interconnection pattern of the word line and the bit line in a DRAM is set to the minimum pitch in the memory cell region. Referring to FIG. 26, adjacent word lines 103 or bit lines 104 in the memory cell region extend alternately towards one peripheral region 106 and the other peripheral region 106. The interconnection pitch $P_s$ in peripheral region 106 becomes two times the interconnection pitch $P_m$ of memory cell region 105.

Since the value of pitch $P_s$ is two times the value of pitch $P_m$, the usage of an aperture having 0.22 as the value of $\sigma_1$ and 0.62 as the value of $\sigma_2$ allows the interconnection pattern at peripheral region 106 to be provided in a finish dimension more closer to the design dimension, almost impervious to the light proximity effect.

In the actual exposure apparatus, the tolerable range of the values of $\sigma_1$ and $\sigma_2$ is preferably 0.22±0.02 for $\sigma_1$ and 0.62±0.02 for $\sigma_2$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pattern determination method comprising the steps of:

setting an interconnection width and a distance between said interconnections;

setting a pattern of a mask according to said width and said distance, and a configuration of an aperture for directing exposure light to said mask at a predetermined angle;

calculating intensity distribution of exposure light at a wafer plane emitted from a light source plane and passing through said aperture and said mask;

calculating maximum exposure light intensity or minimum exposure light intensity of said exposure light intensity distribution;

setting reference exposure light intensity;

calculating an amount of defocus with respect to said reference exposure light intensity;

determining qualification/disqualification of forming an optical image of said mask pattern at said wafer plane by said reference exposure light intensity, said maximum exposure light intensity, said minimum exposure light intensity, and said amount of defocus;

forming a pattern formation qualify/disqualify table with data of said image formation qualification/disqualification corresponding to said width and said distance; and determining interconnection width and interconnection distance in a semiconductor device according to said pattern formation qualify/disqualify table.

2. The pattern determination method according to claim 1, wherein said aperture in said step of setting a configuration of an aperture includes an opening formed in each of four regions divided by virtual first and second axes orthogonal to each other with a position corresponding to an optical axis of exposure light as a crossing point, said opening including at least a first opening edge and a second opening edge parallel to said first axis, and located closer to and remote from said first axis, respectively, and a third opening edge and a fourth opening edge parallel to said second axis, and located closer to and remote from said second axis, respectively.

3. A semiconductor pattern formation method comprising the steps of:

setting an interconnection width and a distance between said interconnections;

setting a pattern of a mask according to said width and said distance, and a configuration of an aperture for directing exposure light to said mask at a predetermined angle;

calculating intensity distribution of exposure light at a wafer plane emitted from a light source plane and passing through said aperture and said mask;

calculating maximum exposure light intensity or minimum exposure light intensity of said exposure light intensity distribution;

setting reference exposure light intensity;

calculating an amount of defocus with respect to said reference exposure light intensity;

determining qualification/disqualification of forming an optical image of said mask pattern at said wafer plane by said reference exposure light intensity, said maximum exposure light intensity, said minimum exposure light intensity, and said amount of defocus;

forming a pattern formation qualify/disqualify table with data of said image formation qualification/disqualification corresponding to said width and said distance;

determining interconnection width and interconnection distance in a semiconductor device according to said pattern formation qualify/disqualify table;

forming a mask having a pattern according to said determined interconnection width and interconnection distance; and patterning a predetermined conductive film formed on a semiconductor substrate by applying photolithography and processing using said mask.

* * * * *